(12) United States Patent
Braunisch et al.

(10) Patent No.: US 11,460,499 B2
(45) Date of Patent: Oct. 4, 2022

(54) DUAL SIDED THERMAL MANAGEMENT SOLUTIONS FOR INTEGRATED CIRCUIT PACKAGES

(71) Applicant: Intel Corporation, Santa Clara, CA (US)

(72) Inventors: Henning Braunisch, Phoenix, AZ (US); Aleksandar Aleksov, Chandler, AZ (US); Veronica Strong, Hillsboro, OR (US); Brandon Rawlings, Chandler, AZ (US); Johanna Swan, Scottsdale, AZ (US); Shawna Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 410 days.

(21) Appl. No.: 16/573,946

(22) Filed: Sep. 17, 2019

(65) Prior Publication Data

US 2021/0080500 A1 Mar. 18, 2021

(51) Int. Cl.
*H01L 23/498* (2006.01)
*H01L 23/538* (2006.01)
*H01L 23/31* (2006.01)
*G01R 31/28* (2006.01)
(Continued)

(52) U.S. Cl.
CPC ......... *G01R 31/2877* (2013.01); *G01K 7/425* (2013.01); *H01L 23/49822* (2013.01); *H01L 23/49883* (2013.01); *H01L 23/5384* (2013.01); *G01K 7/021* (2013.01)

(58) Field of Classification Search
CPC ......... H01L 23/49822; H01L 23/49833; H01L 23/3121; H01L 23/5384
See application file for complete search history.

(56) References Cited

U.S. PATENT DOCUMENTS

| 9,768,145 | B2 | 9/2017 | Yu et al. | |
|---|---|---|---|---|
| 2013/0147026 | A1* | 6/2013 | Topacio | H01L 23/49816 257/E23.101 |
| 2017/0062383 | A1* | 3/2017 | Yee | H01L 23/49838 |

(Continued)

OTHER PUBLICATIONS

Notice of Allowance for U.S. Appl. No. 16/573,948, dated Jun. 11, 2021.

(Continued)

*Primary Examiner* — Omar F Mojaddedi
(74) *Attorney, Agent, or Firm* — Essential Patents Group, LLP.

(57) ABSTRACT

An integrated circuit package having an electronic interposer comprising an upper section, a lower section and a middle section, a die side integrated circuit device electrically attached to the upper section of the electronic interposer, a die side heat dissipation device thermally contacting the die side integrated circuit device, a land side integrated circuit device electrically attached to the lower section of the electronic interposer, and a land side heat dissipation device thermally contacting the at least one die side integrated circuit device. The upper section and the lower section may each have between two and four layers and the middle section may be formed between the upper section and the lower section, and comprises up to eight layers, wherein a thickness of each layer of the middle section is thinner than a thickness of any of the layers of the upper section and the lower section.

10 Claims, 20 Drawing Sheets

(51) Int. Cl.
  *G01K 7/42* (2006.01)
  *G01K 7/02* (2021.01)

(56) References Cited

U.S. PATENT DOCUMENTS

2018/0358328 A1* 12/2018 Kang .................... H01L 21/568
2019/0164912 A1*  5/2019 Lee ..................... H01L 23/5383
2020/0006186 A1*  1/2020 Pan .................... H01L 23/49827

OTHER PUBLICATIONS

Non-Final Office Action for U.S. Appl. No. 16/573,943, dated Sep. 23, 2020.
Notice of Allowance for U.S. Appl. No. 16/573,943, dated Jan. 13, 2021.
Office Action for U.S. Appl. No. 16/573,948, dated Mar. 4, 2021.

* cited by examiner

DUAL SIDED THERMAL MANAGEMENT SOLUTIONS FOR INTEGRATED CIRCUIT PACKAGES

TECHNICAL FIELD

Embodiments of the present description generally relate to the field of integrated circuit package fabrication, and, more specifically, to the incorporation of the thermal solutions into integrated circuit packages for the removal of heat from integrated circuit devices disposed therein.

BACKGROUND

The integrated circuit industry is continually striving to produce ever faster, smaller, and thinner integrated circuit packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. This issue becomes even more critical when multiple integrated circuit devices are incorporated into multi-device or multi-chip packages (MCPs). In such multi-chip packages, some of the integrated circuit devices will be "internally" positioned between adjacent integrated circuit devices, interposers, and/or substrates, or be embedded with interposers. As such, these internally positioned integrated circuit devices may be partially isolated from thermal management solutions, such as heat spreaders, since the integrated circuit devices and/or the substrate to which the integrated circuit devices may be adjacent, are generally not efficient thermal conductors, nor are the various intervening layers, such as thermal interface material layers, underfill materials, and the like, which are between the internally positioned integrated circuit device and the thermal management solutions. Thus, the internally positioned integrated circuit devices may exceed their temperature limits, which may require throttling (speed reduction of the integrated circuit devices) that can lead to reduced performance, or, in extreme cases, can lead to damage and failure of the entire integrated circuit package. Alternately, if the integrated circuits have thermal throttling control, they may reduce their operating frequency and, thus, their power to operate at lower temperature and avoid failures. However, this results in lower overall performance.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
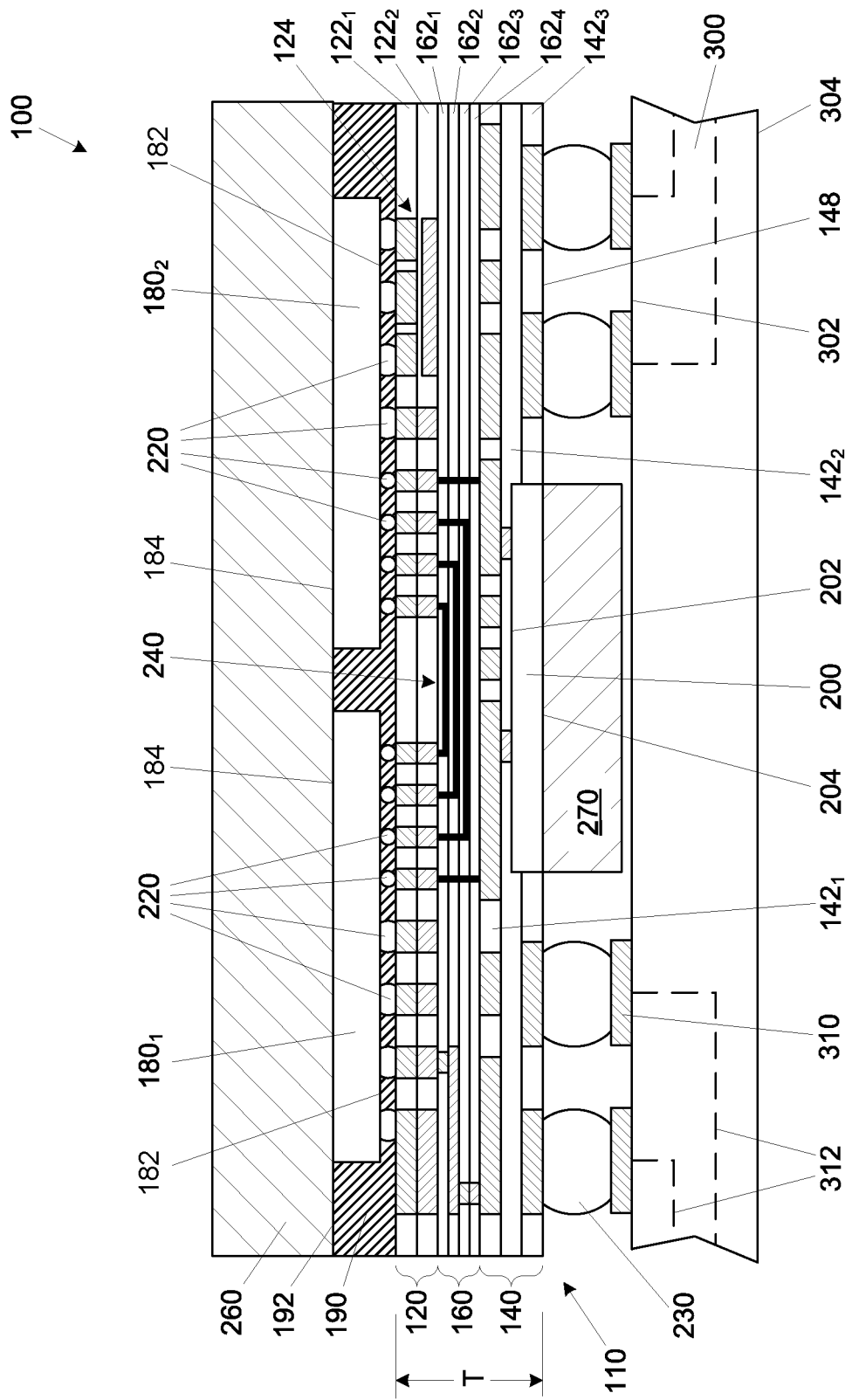
FIG. 1 is a side cross-sectional view of an integrated circuit package mounted to an electronic substrate, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description include an integrated circuit package having an electronic interposer comprising an upper section, a lower section and a middle section, at least one die side integrated circuit device electrically attached to the upper section of the electronic interposer, at least one die side heat dissipation device thermally contacting the at least one die side integrated circuit device, at least one land side integrated circuit device electrically attached to in the lower section of the electronic interposer, and at least one land side heat dissipation device thermally contacting the at least one die side integrated circuit device. The upper section and the lower section may each have between two and four layers, wherein each layer comprises an organic material layer and at least one conductive route comprising at least one conductive trace and at least one conductive via. The middle section may be formed between the upper section and the lower section, wherein the middle section comprises up to eight layers, wherein each layer comprises an organic material and at least one conductive route comprising at least one conductive trace and at least one conductive via. A thickness of each layer of the middle section is thinner than a thickness of any of the layers of the upper section and thinner than a thickness of any of the layers of the lower section.

FIG. 1 illustrates an integrated circuit package 100 of the present description, which includes an electronic interposer 110 and at least one die side integrated circuit device (illustrated as a first die side integrated circuit device $180_1$ and a second die side integrated circuit device $180_2$) electrically attached to the electronic interposer 110. The first die side integrated circuit device $180_1$ and the second die side integrated circuit device $180_2$ (as well as any further integrated circuit devices that may be utilized) may be any appropriate device, including, but not limited to, a microprocessor, a chipset, a graphics device, a wireless device, a memory device, art application specific integrated circuit device, combinations thereof, stacks thereof, and the like.

As shown in FIG. 1, the electronic interposer 110 may be formed having an upper section 120, a lower section 140, and a middle section 160 between the upper section 120 and the lower section 140. In one embodiment, the total thickness T of the electronic interposer 110 may be between about 30 microns and 100 microns.

As further shown in FIG. 1, the first die side integrated circuit device $180_1$ and the second die side integrated circuit device $180_2$ may be attached to the upper section 120 of the electronic interposer 110 through a plurality of die side device-to-interposer interconnects 220, such as reflowable solder bumps or balls, in a configuration generally known as a flip-chip or controlled collapse chip connection ("C4") configuration. The die side device-to-interposer interconnects 220 may extend between bond pads (not shown) on an active surface 182 of the first die side integrated circuit device $180k$ and an active surface 182 of the second die side integrated circuit device $180_2$ and corresponding bond pads (not shown) on the upper section 120 of the electronic interposer 110 to form electrical connections therebetween. It is understood that the die side device-to-interposer interconnects 220 may be in electrical communication with integrated circuitry (not shown) within the first die side integrated circuit device $180_1$, and may be in electrical communication with integrated circuitry (not shown) within the second die side integrated circuit device $180_2$.

The die side device-to-interposer interconnects 220 may be any appropriate electrically conductive material or structure, including but not limited to, solder balls, metal bumps or pillars, metal filled epoxies, or a combination thereof. In one embodiment, the die side device-to-interposer interconnects 220 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the die side device-to-interposer interconnects 220 may be copper bumps or pillars. In a further embodiment, the die side device-to-interposer interconnects 220 may be metal bumps or pillars coated with a solder material.

In one embodiment, a mold material layer 190, such as an epoxy material, may be used to at least partially encase the first die side integrated circuit device $180_1$ and the second die side integrated circuit device $180_2$. In an embodiment, the mold material layer 190 may have an outer surface 192 that is substantially on the same plane with a back surface 184 of the first die side integrated circuit device $180_1$ and the back surface 184 of the second die side integrated circuit device $180_2$. The processing and techniques for encasing integrated circuit device in a mold material layer are well known in the art and for purposes of clarity and conciseness are not discussed herein.

As further shown in FIG. 1, at least one die side heat dissipation device 260 may be thermally connected to the back surface 184 of the first die side integrated circuit device $180_1$ and the back surface 184 of the second die side integrated circuit device $180_2$. As shown, the at least one die side heat dissipation device 260 may also abut or be otherwise attached to the outer surface 192 of the mold material layer 190. As will be understood to those skilled in the art, a thermal interface material (not shown) may be disposed between the at least one die side heat dissipation device 260 and, either one or both of, the back surface 184 of the first die side integrated circuit device $180_1$ and the back surface 184 of the second die side integrated circuit device $180_2$. It is further understood that, either one or both of, the back surface 184 of the first die side integrated circuit device $180_1$ and the back surface 184 of the second die side integrated circuit device $180_2$ may include a metal layer formed therein to enhance heat transfer. The at least one die side heat dissipation device 260 may be any appropriate thermal solution, including but not limited to, passive thermal solutions, such as a heat slug and the like, or active thermal solutions, such as a heat pipe, a jumping drop vapor chamber, a thermoelectric cooling device, a heat pump, and the like.

Figure 6:
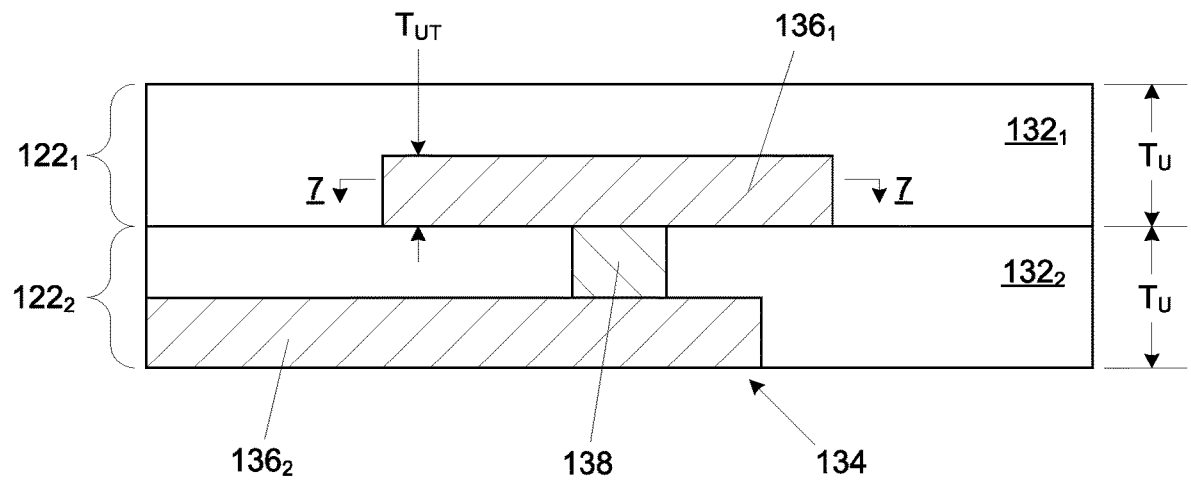
FIG. 6 is a side cross-sectional view of the upper section of the electronic interposer of FIG. 1, according to an embodiment of the present description.

As further shown in FIG. 1, the electronic interposer 110 may be electrically attached to an electronic substrate 300, such as a motherboard or other such substrate, through a plurality of external interconnects 230. The external interconnects 230 may extend from bond pads (shown as a portion of conductive traces 1563 of FIG. 6, as will be discussed) on the lower section 140 of the electronic interposer 110, and bond pads 310 on a first surface 302 of the electronic substrate 300. The bond pads 310 of the electronic substrate 300 may be electrically attached to conductive routes 312 within the electronic substrate 300, wherein the conductive routes 312 may be in electrical communication with external components (not shown), as will be understood to those skilled in the art. In one embodiment, the external interconnects 230 may be solder balls in a ball grid array having a pitch of less than or equal to about 350 microns. In another embodiment, the external interconnects 230 may be lands in a land grid array having a pitch of less than or equal to about 1 millimeter.

In a further embodiment, at least one land side integrated circuit device 200 may be embedded in and electrically attached to the lower section 140 of the electronic interposer 110. The land side integrated circuit device 200 may be passive or active, as will be understood to those skilled in the art. In one embodiment, the at least one land side integrated circuit device 200 may be a voltage regulator for at least one of the first die side integrated circuit device 180$_1$ and the second die side integrated circuit device 180$_2$. An active surface 202 for the at least one land side integrated circuit device 200 may be electrically connected to conductive traces (see conductive traces 1563 of FIG. 6, as will be discussed)) within the lower section 140 of the electronic interposer 110. It is understood that the electronic interposer 110 may be in electrical communication with integrated circuitry (not shown) within the at least one land side integrated circuit device 200. In one embodiment, the active surface 202 of the land side integrated circuit device 200 may be substantially in the same plane as an outer surface 148 of the lower section 140 of the electronic interposer 110.

As further shown in FIG. 1, at least one land side heat dissipation device 270 may be thermally connected to a back surface 204 of the land side integrated circuit device 200. As will be understood to those skilled in the art, a thermal interface material (not shown) may be disposed between the at least one land side heat dissipation device 270 and the back surface 204 of the land side integrated circuit device 200. It is further understood that the back surface 204 of the land side integrated circuit device 204 may include a metal layer (not shown) formed thereon to enhance heat transfer. The at least one land side heat dissipation device 270 may be any appropriate thermal solution, including but not limited to, passive thermal solutions, such as a heat slug and the like, or active thermal solutions, such as a heat pipe, a jumping drop vapor chamber, a thermoelectric cooling device, a heat pump, and the like.

Figure 2:
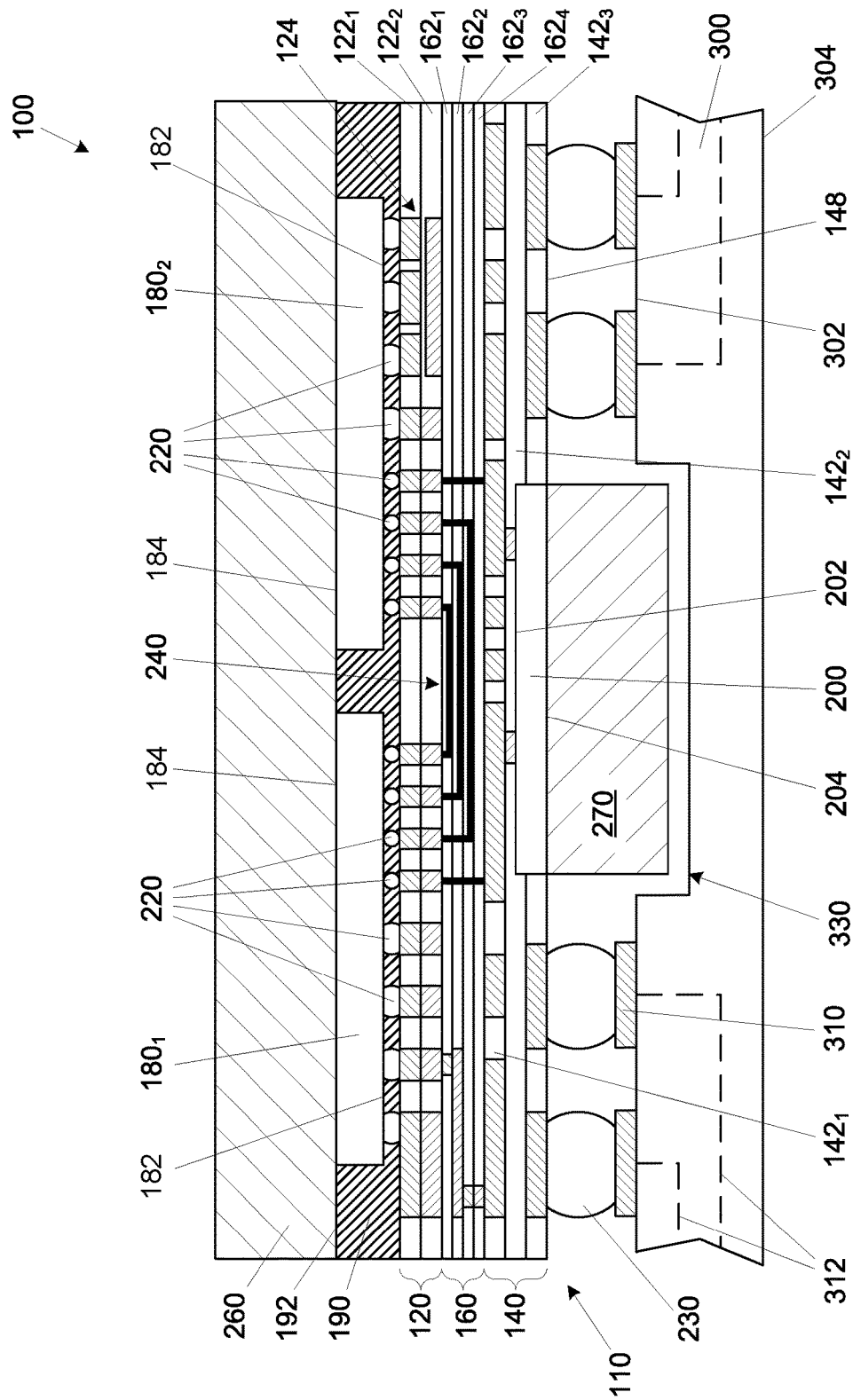
FIG. 2 is a side cross-sectional view of an integrated circuit package mounted to an electronic substrate having a recess for a heat dissipation device, according to one embodiment of the present description.
Figure 3:
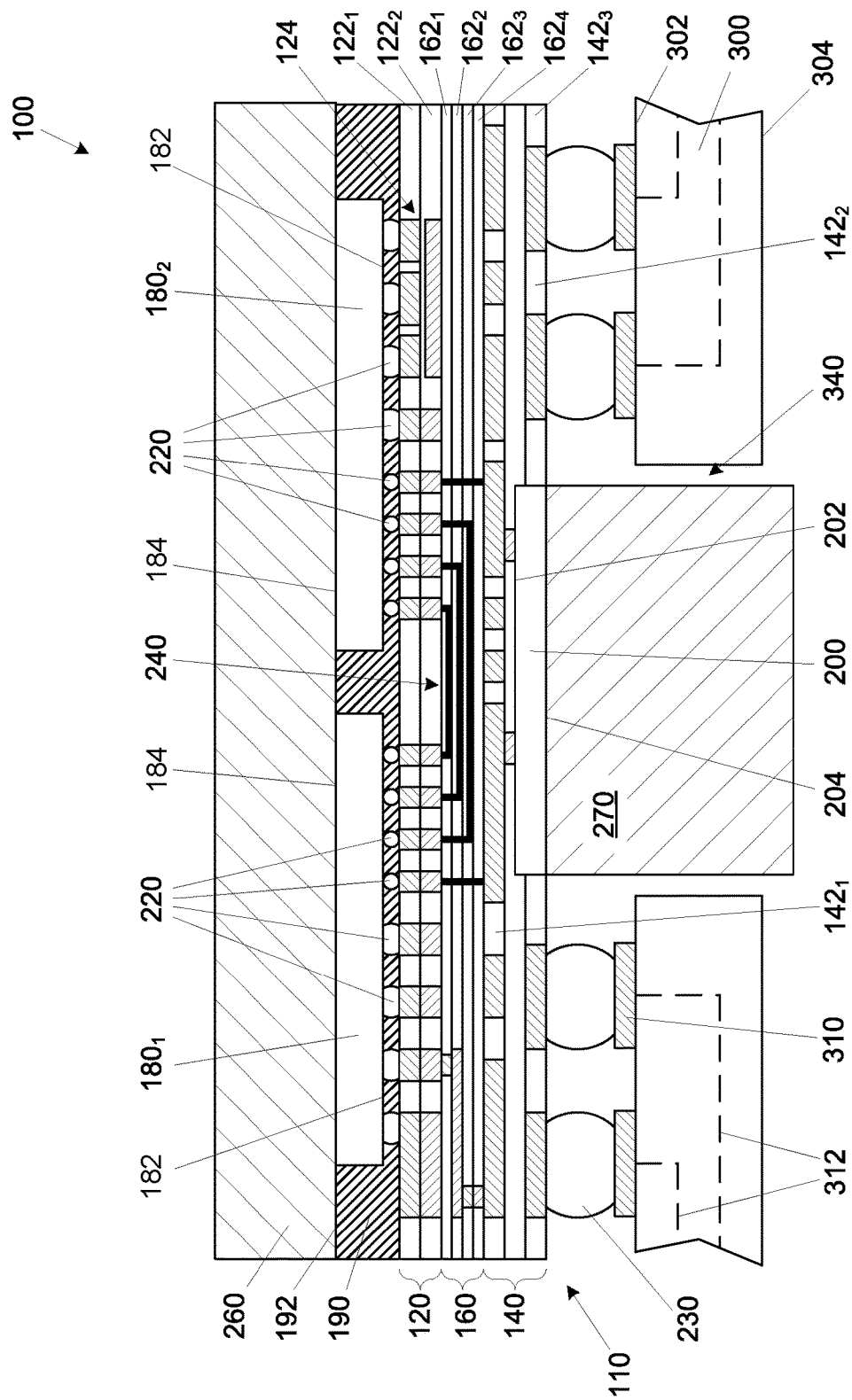
FIG. 3 is a side cross-sectional view of an integrated circuit package mounted to an electronic substrate having an opening therethrough for a heat dissipation device, according to one embodiment of the present description.
Figure 4:
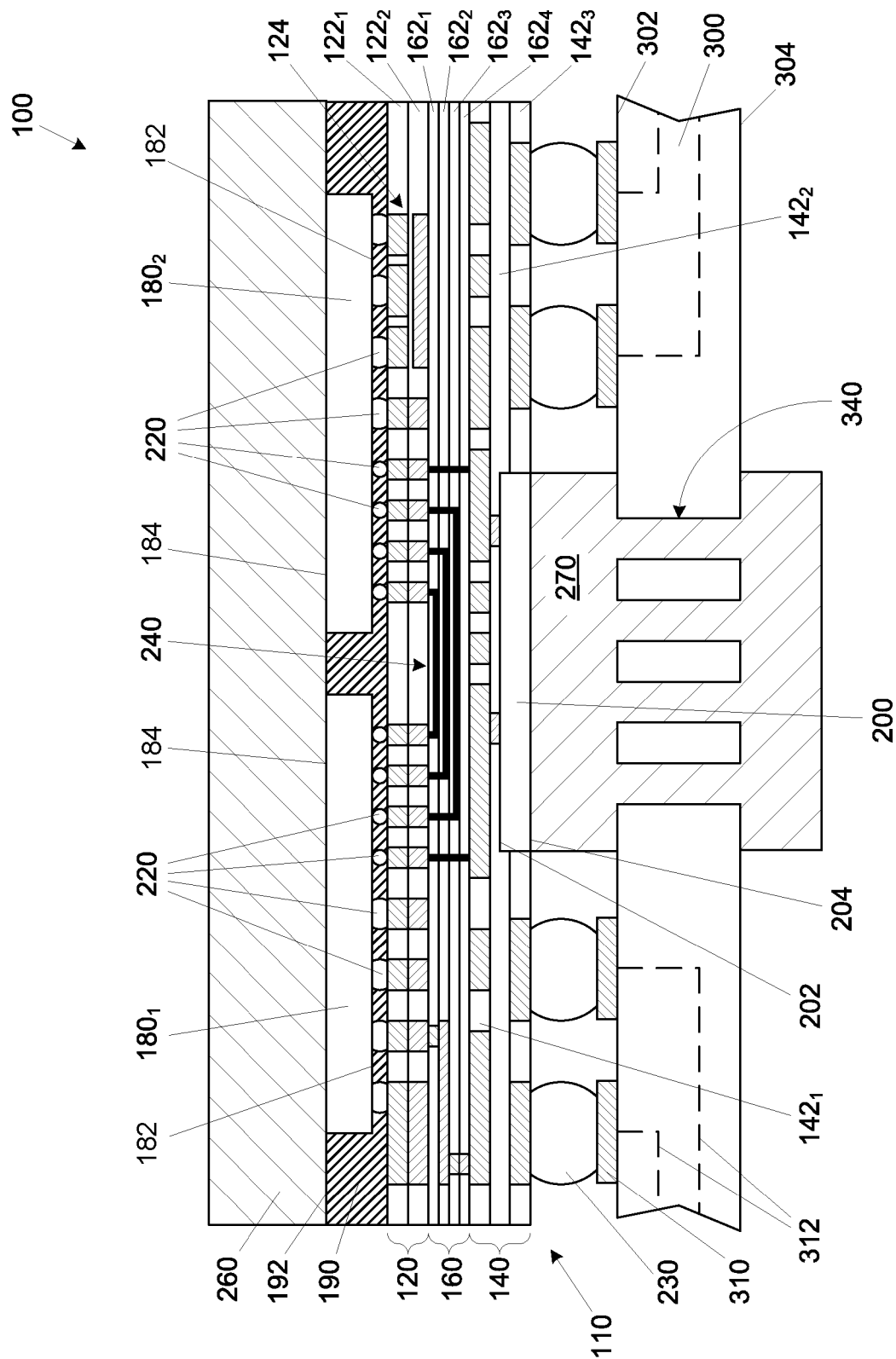
FIG. 4 is a side cross-sectional view of an integrated circuit package mounted to an electronic substrate having an opening therethrough for a heat dissipation device, according to another embodiment of the present description.

Although the embodiment shown in FIG. 1 illustrates the at least one land side heat dissipation device 270 fitting between the at least one land side integrated circuit device 200 and the electronic substrate 300, the at least one land side heat dissipation device 270 may not so fit. In one embodiment, as shown in FIG. 2, a recess 330 may be formed in the electronic substrate 300, wherein at least a portion of the at least one heat dissipation device 270 extends into the recess 330. In another embodiment, as shown in FIG. 3, at least one opening 340 may be formed to extend through the electronic substrate 300 from the first surface 302 to an opposing second surface 304 thereof. In a further embodiment, as shown in FIG. 4, the at least one land side heat dissipation device 270 may be incorporated within the electronic substrate 300, such as portions thereof extending through openings 340 extending through the electronic substrate 300 from the first surface 302 to an opposing second surface 304 thereof.

Figure 5:
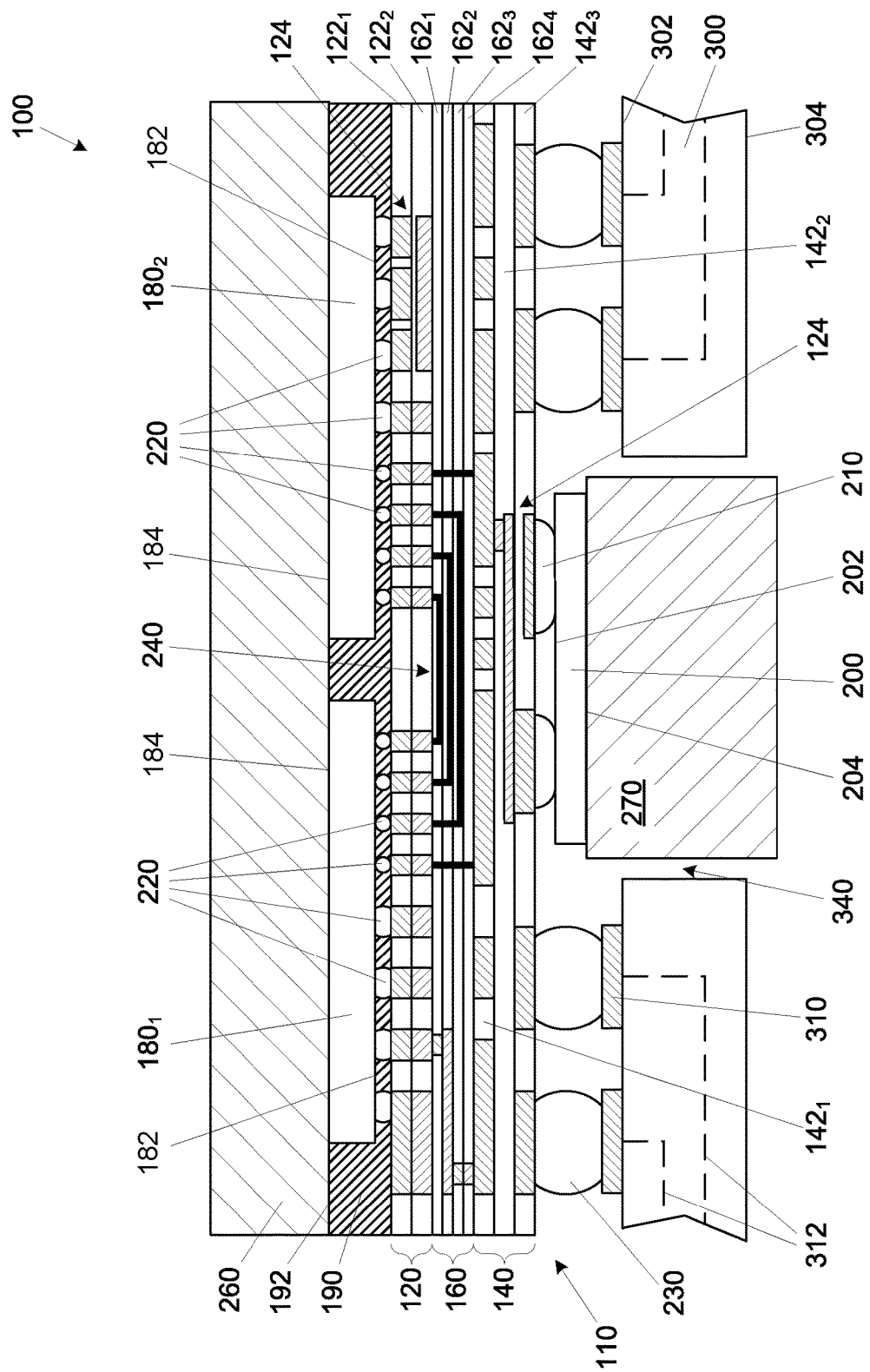
FIG. 5 is a side cross-sectional view of an integrated circuit package mounted to an electronic substrate that has a heat dissipation device formed therein, according to one embodiment of the present description.

Although the embodiments of FIGS. 1-4 show at least one land side integrated circuit device 200 being embedded in the lower section 140 of the electronic interposer 110, the embodiments of the present description are not so limited. As shown in FIG. 5, the active surface 202 of the land side integrated circuit device 200 may be attached to the lower section 140 of the electronic interposer 110 through a plurality of land side device-to-interposes interconnects 210, such as a solder material. The land side device-to-interposer interconnects 210 may extend between bond pads (not shown) of the at least one land side integrated circuit device 200 and corresponding bond pads (shown as a portion of conductive traces 1563 of FIG. 6, as will be discussed) on the lower section 140 of the electronic interposer 110 to form electrical connections therebetween.

Figure 7:
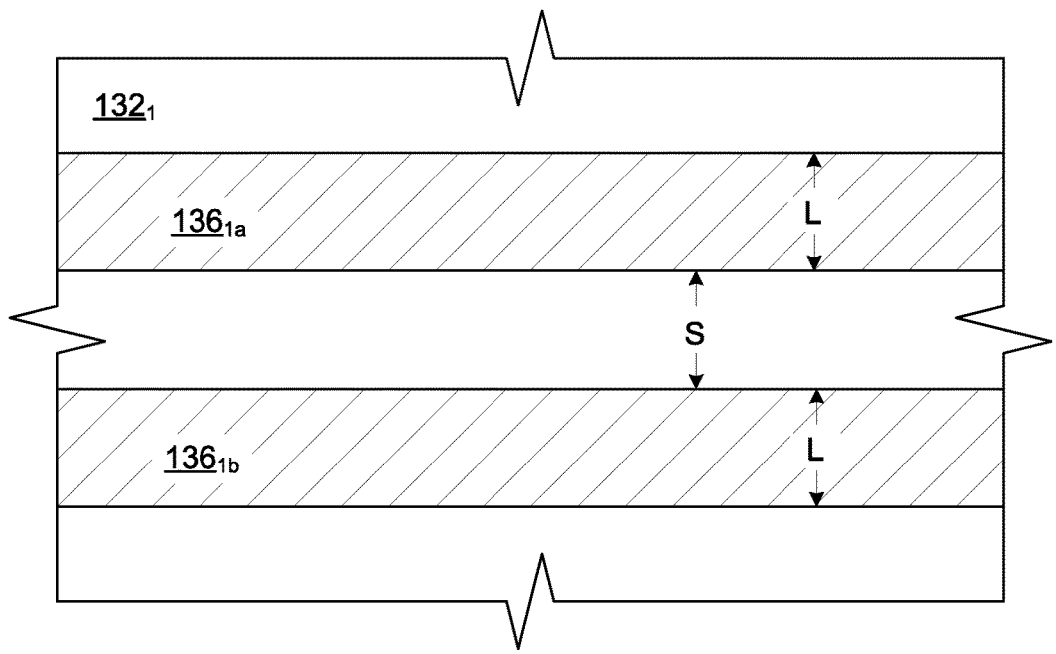
FIG. 7 is a side cross-sectional view along line 7-7 of FIG. 6, according to one embodiment of the present description.

In one embodiment shown in FIG. 1, the upper section 120 may include at least two layers, illustrated as a first layer 122$_1$ and a second layer 122$_2$. In an embodiment, the upper section 120 has between two and four layers. In an embodiment shown in FIG. 6, the first layer 122$_1$ and the second layer 122$_2$ may each have a thickness $T_U$ of between about 13 and 40 microns. In another embodiment shown in FIG. 6, the first layer 122$_1$ and the second layer 122$_2$ may each comprise a first organic dielectric material layer 132$_1$ and a second organic dielectric material layer 132$_2$, each dielectric layer can be comprised of the same or different material, respectively, and at least one conductive route 134, comprising at least one first conductive trace 136$_1$ within the first organic dielectric material layer 132$_1$, at least one second conductive trace 136$_2$ within the second organic dielectric material layer 132$_2$ and at least one conductive via 138 electrically connecting the at least one first conductive trace 136$_1$ and the at least one second conductive trace 136$_2$. In one embodiment, the at least one first conductive trace 136$_1$ may have a thickness $T_{UT}$ of between about 8 and 15 microns. In a further embodiment, shown in FIG. 7, the conductive traces (shown as first conductive traces 136$_{1a}$ and 136$_{1b}$) in one of the dielectric material layers (shown as first organic dielectric material layer 132$_1$) may have a line width L of about 8 microns or greater, and a line spacing S of about 8 microns or greater. The at least one first conductive trace 136$_1$, the at least one second conductive trace 136$_2$, and the at least one conductive via 138 may be made of any appropriate conductive material, including but not limited to, metals, such as copper, silver, nickel, gold, and aluminum, alloys thereof, and the like. The conductive vias 138 can be formed by any appropriate process known in the art, including, but not limited to, lithographically defined vias, zero-misalignment vias (described in, for example, U.S. Pat. No. 9,713,264), self-aligned vias (described in, for example, U.S. Patent Publication No. 2018/0233431 A1), or the like. In one embodiment, at least one passive component 124, such as a thin film capacitor may be formed in the upper section 120 of the electronic interposer 110.

Figure 8:
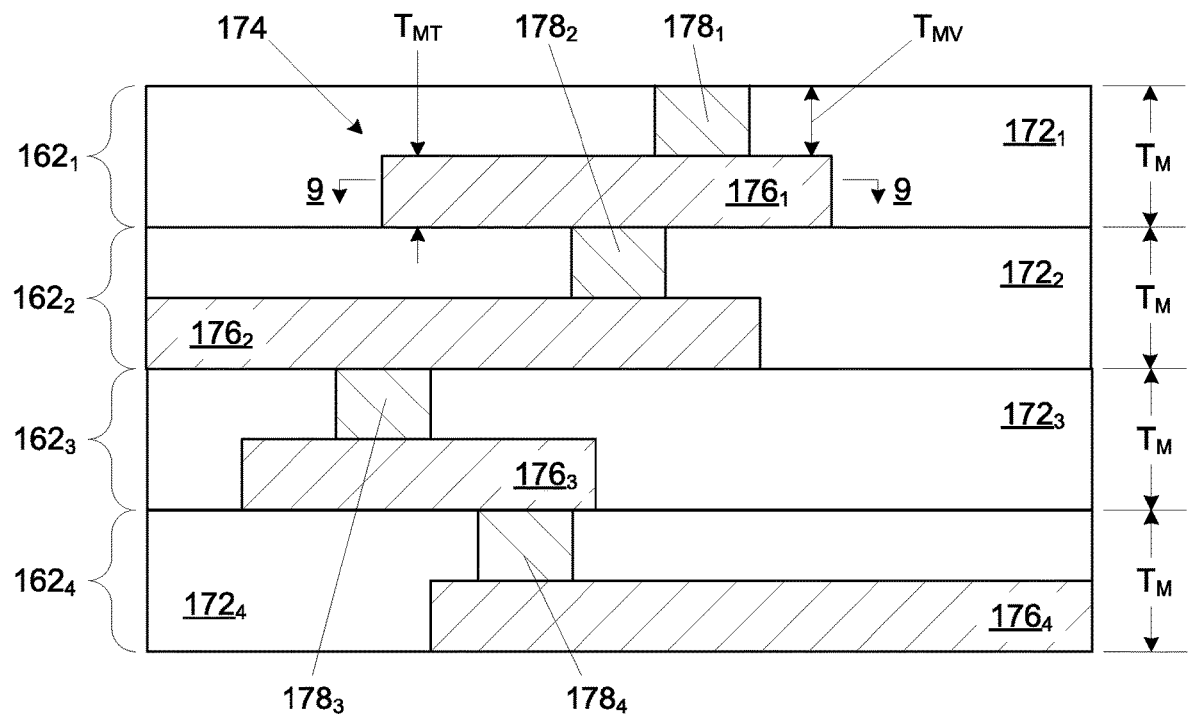
FIG. 8 is a side cross-sectional view of the middle section of the electronic interposer of FIG. 1, according to an embodiment of the present description.
Figure 9:
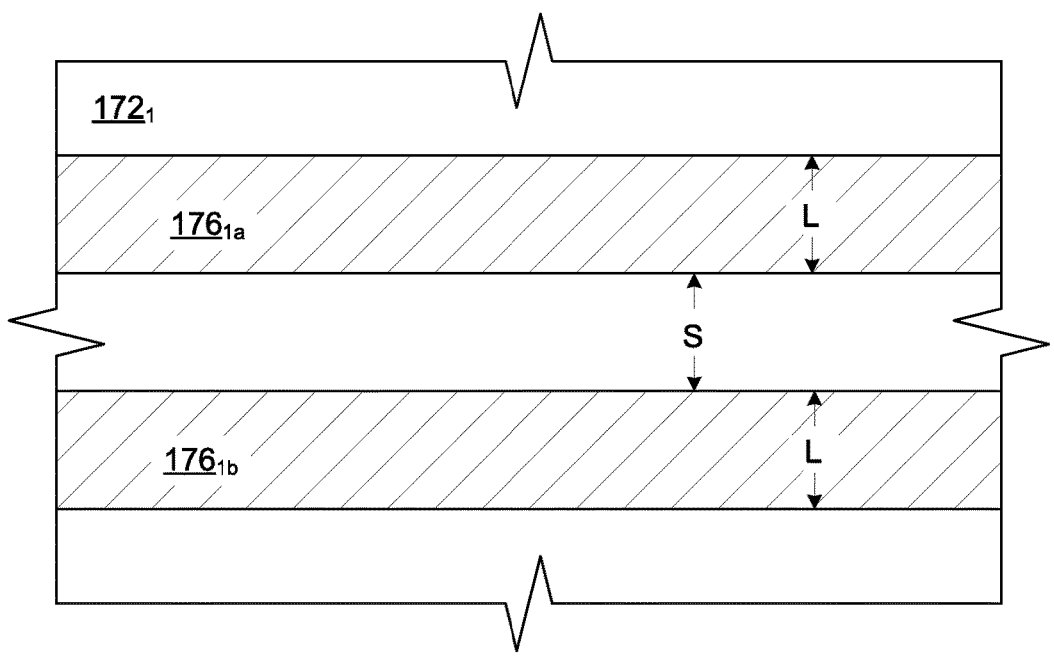
FIG. 9 is a side cross-sectional view along line 9-9 of FIG. 8, according to one embodiment of the present description.

In one embodiment shown in FIG. 1, the middle section 160 may include up to eight layers, i.e. between one and eight layers, illustrated as four layers, i.e. layers $162_1$ through $162_4$. In an embodiment shown in FIG. 8, each of the layers (e.g. layers $162_1$-$162_4$) of the middle section 160 may have a thickness $T_M$ of between about 1.5 and 9 microns. In another embodiment, each of the layers $162_1$-$162_4$ may comprise an organic dielectric material layer $172_1$-$172_4$ (each dielectric layer can be comprised of the same or different material) and at least one conductive route 174, comprising at least one conductive trace $176_1$-$176_4$ and at least one conductive via $178_1$-$178_4$. In one embodiment, the at least one conductive trace $176_1$-$176_4$ may have a thickness $T_{MT}$ of between about 0.5 and 4 microns, and at least one conductive via $178_1$-$178_4$ may have a thickness $T_{MV}$ of between about 1 and 6 microns. In a further embodiment, shown in FIG. 9, the conductive traces (shown as conductive traces $176_{1a}$ and $176_{1b}$) in one of the organic dielectric material layers (shown as first organic dielectric material layer $172_1$) may have a line width L of between about 0.75 microns and 3 microns, and a line spacing S of between about 0.75 microns and 3 microns. As will be understood to those skilled in the art, the middle section 160 may be used primarily as a routing layer. It is further understood that at least one of the layers $162_1$-$162_4$ of the middle section 160 may be used for ground shielding between any of the layers $162_1$-$162_4$ of the middle section 160. The at least one conductive trace $176_1$-$176_4$ and the at least one conductive via $178_1$-$178_4$ may be made of any appropriate conductive material, including but not limited to, metals, such as copper, silver, nickel, gold, and aluminum, alloys thereof, and the like. The conductive vias $178_1$-$178_4$ can be formed by any appropriate process known in the art, including, but not limited to, lithographically defined vias, zero-misalignment vias, self-aligned vias, or the like.

Figure 10:
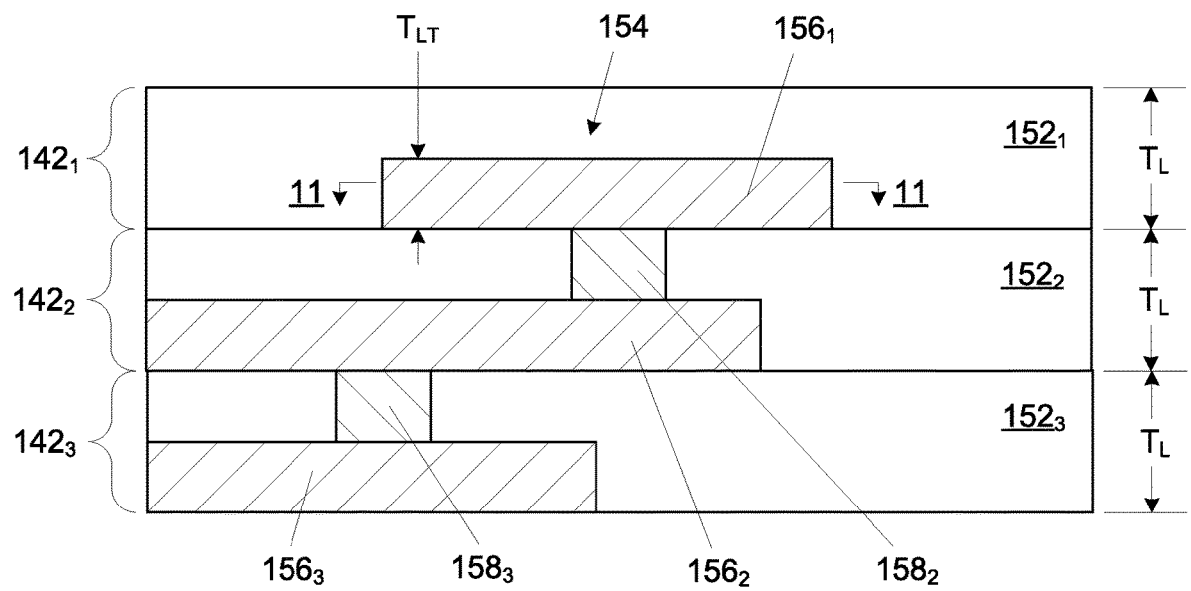
FIG. 10 is a side cross-sectional view of the lower section of the electronic interposer of FIG. 1, according to an embodiment of the present description.
Figure 11:
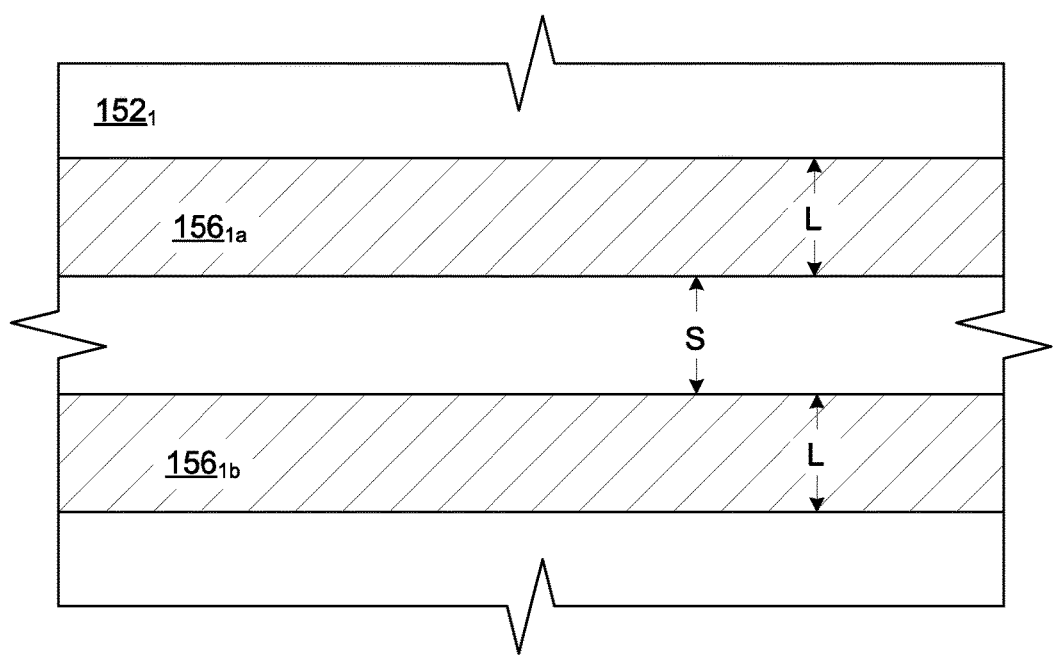
FIG. 11 is a side cross-sectional view along line 11-11 of FIG. 10, according to one embodiment of the present description.

In one embodiment shown in FIG. 1, the lower section 140 may include at least two layers, illustrated as a first layer $142_1$, a second layer $142_2$, and a third layer $142_3$. In a specific embodiment, the lower section 140 has between two and four layers. In an embodiment shown in FIG. 10, the first layer $142_1$, the second layer $142_2$, and the third layer $142_3$ may each have a thickness $T_L$ of between about 13 and 40 microns. In another embodiment shown in FIG. 10, the first layer $142_1$, the second layer $142_2$, and the third layer $142_3$ may comprise a first organic material layer $152_1$, a second organic dielectric material layer $152_2$, and a third organic dielectric material layer $152_3$, each dielectric layer can be comprised of the same or different material, respectively, and at least one conductive route 154, comprising at least one first conductive trace $156_1$, at least one second conductive trace $156_2$, and at least one third conductive trace $156_3$, wherein at least one first conductive via $158_1$ electrically connects the at least one first conductive trace $156_1$ and the at least one second conductive trace $156_2$, and wherein at least one second conductive via $158_2$ electrically connects the at least one second conductive trace $156_2$ and the at least one third conductive trace $156_3$. In one embodiment, the at least one first conductive trace $156_1$ may have a thickness $T_{LT}$ of between about 8 and 15 microns. In a further embodiment, shown in FIG. 11, the conductive traces (shown as conductive traces $156_{1a}$ and $156_{1b}$) in one of the organic dielectric layers (shown as first organic dielectric layer $152_1$) may have a line width L of about 8 microns or greater, and a line spacing S of about 8 microns or greater. The at least one conductive trace $156_1$, $156_2$, $156_3$ and the at least one conductive via $158_2$, $158_3$ may be made of any appropriate conductive material, including but not limited to, metals, such as copper, silver, nickel, gold, and aluminum, alloys thereof, and the like. The conductive vias $158_2$, $158_3$ can be formed by any appropriate process known in the art, including, but not limited to, lithographically defined vias, zero-misalignment vias, self-aligned vias, or the like. In one embodiment, as shown in FIG. 1, at least one passive component 124, such as a thin film capacitor may be formed in the lower section 140 of the electronic interposer 110.

As previously discussed, the electronic interposer 110 may be an organic interposer, meaning that the electronic interposer 110 uses organic-based materials as its dielectric layers. These organic dielectric materials may be composites that consist of an organic matrix and filler particles. The organic matrix may comprise any appropriate polymer, including but not limited to epoxide polymers, polyimides, and the like. In one embodiment, the organic dielectric materials may be buildup films, as known in the art, that can be laminated onto a wafer or onto a glass-panel (or any other carrier substrate). In another embodiment, the organic dielectric materials may be supplied in liquid form and then dispensed through nozzles in a spin-coating process (such as for round wafer-format carriers) or by slit-coating (such as for square format panels). The organic dielectric materials may have coefficients of thermal expansion of between about 9 and 25 ppm/° C. and may have elastic moduli of between about 1 and 20 GPa. It is understood that the organic dielectric materials need not be photo-imageable or filled. The filler particles may be any appropriate filler, including, but not limited to, silicon dioxide particles, carbon-doped oxide particles, various known low-k dielectric particles (dielectric constants less than about 3.6), and the like.

Figure 12:
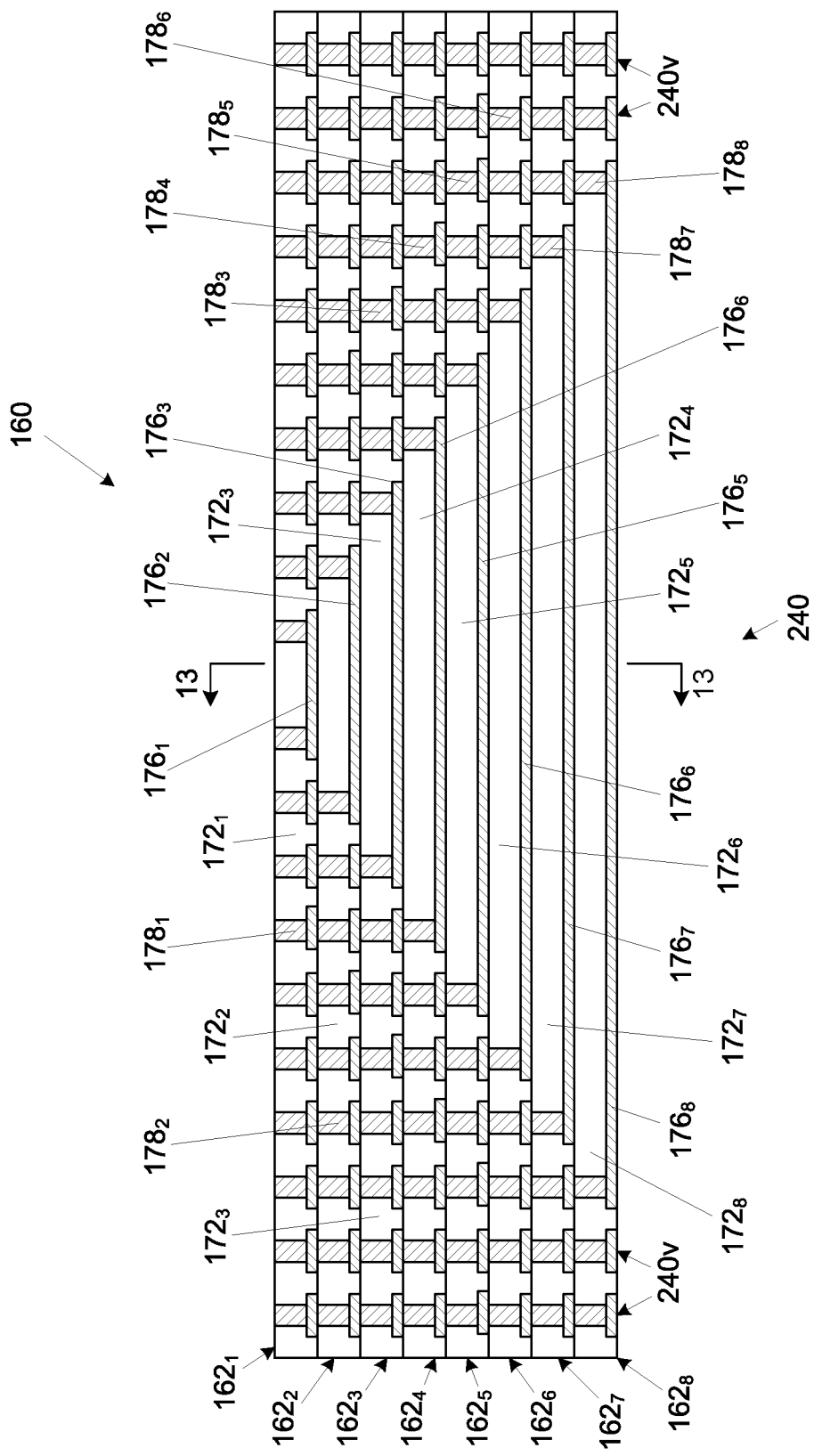
FIG. 12 is a side cross-sectional view of high-density device-to-device conductive routes, according to one embodiment of the present description.

As further shown in FIG. 1, the electronic interposer 110 may further include high-density device-to-device conductive routes 240 within the middle section 160 that provides electrical communication between the first integrated circuit device $180_1$ and the second integrated circuit device $180_2$. FIG. 12 provides a closer view of the high-density device-to-device conductive routes 240 with an eight-layer middle section 160 (i.e. layers $162_1$-$162_8$). The high-density device-to-device conductive routes 240 are fabricated from the conductive traces $176_1$-$176_8$ and the conductive vias $178_1$-$178_8$ during the fabrication of the middle section 160 of the electronic interposer 110. As further shown in FIG. 12, the high-density device-to-device conductive routes 240 may include high-density vertical interconnects 240v (e.g. stacked vias) for electrical interconnection between the upper section 120 and the lower section 140 of the electronic interposer 110 (see FIG. 1).

Figure 13:
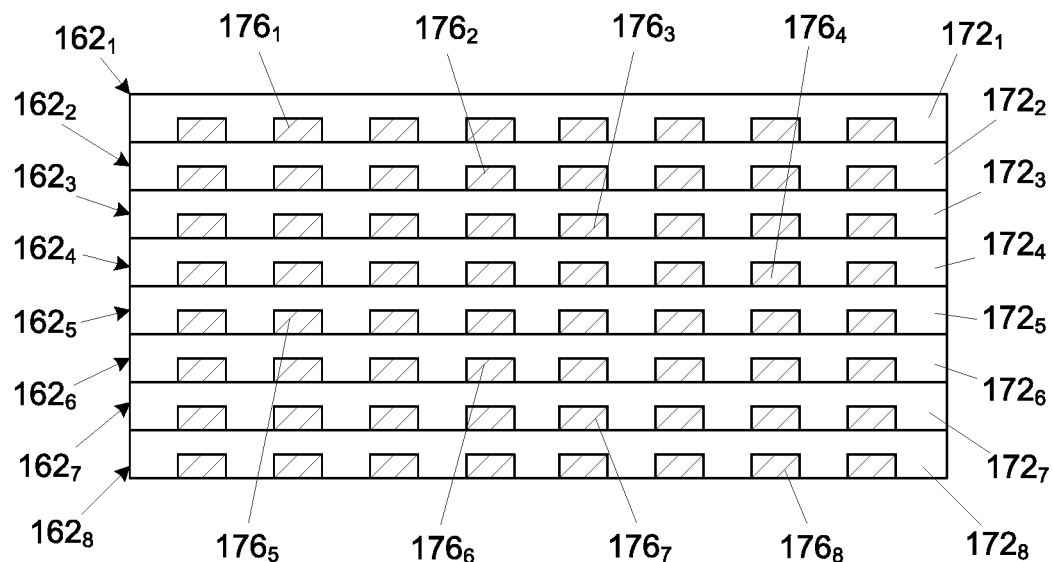
FIGS. 13-17 are side cross-sectional views of various configurations of high-density device-to-device conductive routes, according to embodiments of the present description.
Figure 14:
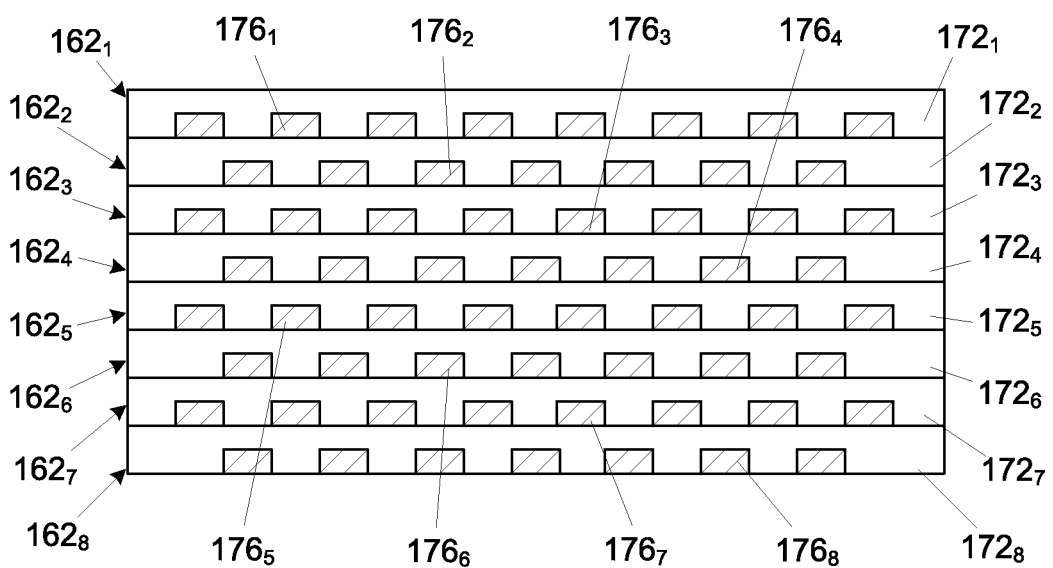
Figure 15:
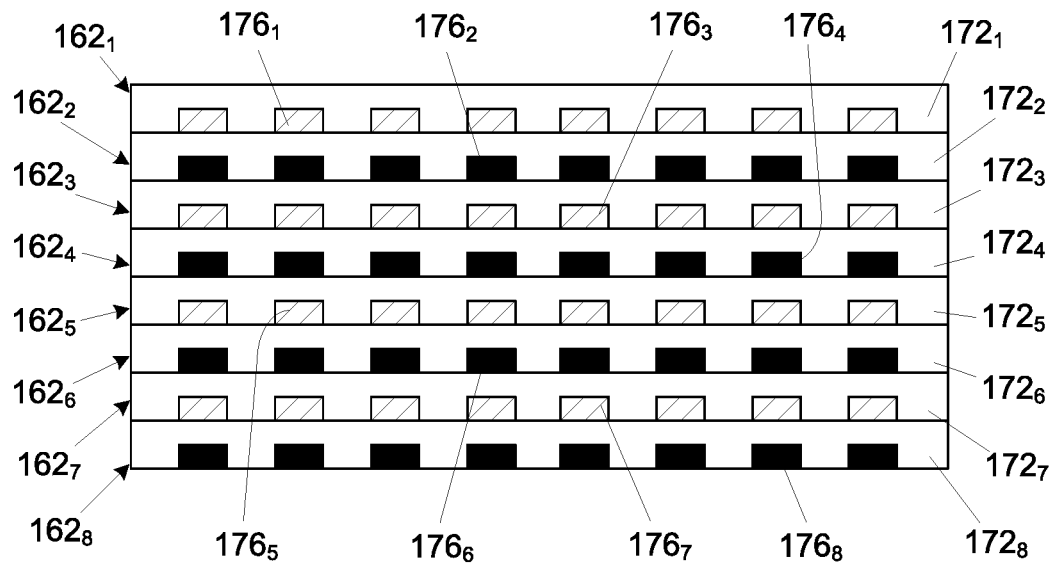
Figure 16:
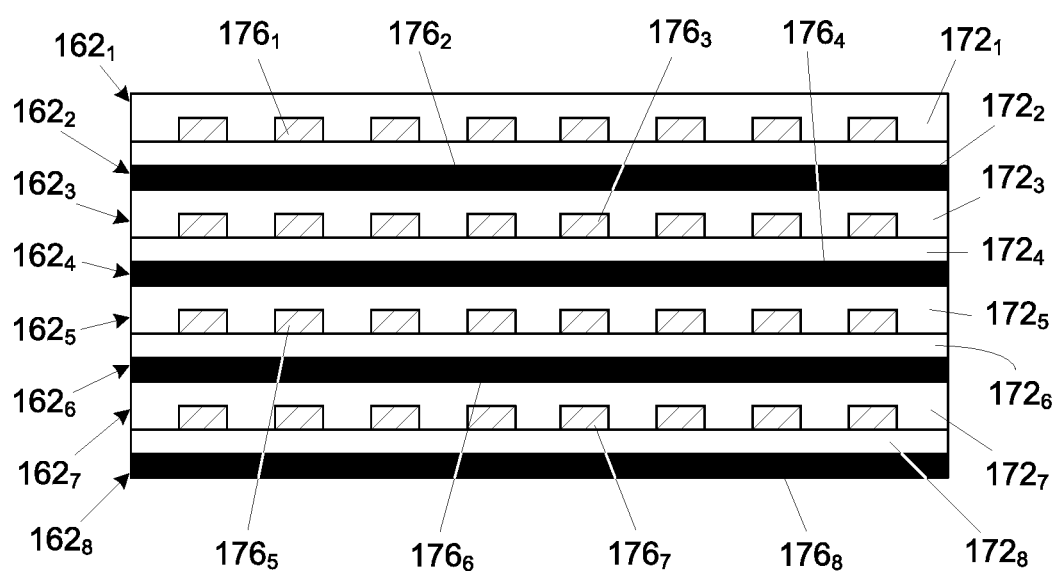
Figure 17:
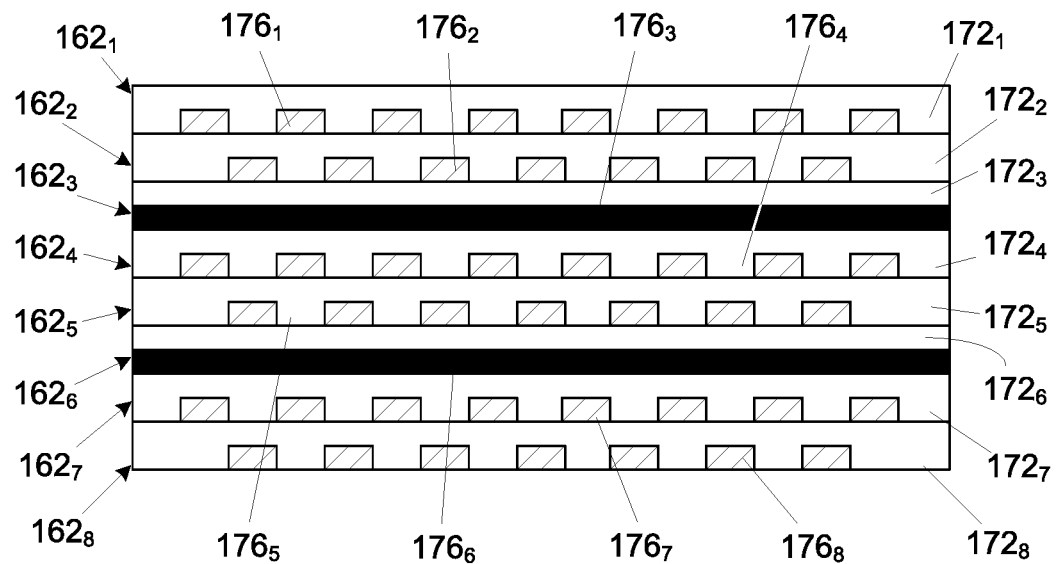

FIGS. 13-17 illustrate potential configurations of the high-density device-to-device conductive traces $176_1$-$176_8$, along line 13-13 of FIG. 12. In one embodiment, as shown in FIG. 13, all of the high-density device-to-device conductive traces $176_1$-$176_8$ may be used for signalling and are organized in ordered rows and columns. In another embodiment, as shown in FIG. 14, all of the high-density device-to-device conductive traces $176_1$-$176_8$ may be used for signalling and are organized in a staggered configuration. In an embodiment, as shown in FIG. 15, the high-density device-to-device conductive traces $176_1$-$176_8$ are organized in ordered rows and columns with the high-density device-to-device conductive traces $176_1$, $176_3$, $176_5$, and $176_7$ used for signalling and the high-density device-to-device conductive traces $176_2$, $176_4$, $176_6$, and $176_8$ used for ground/shielding. In one embodiment, as shown in FIG. 16, the high-density device-to-device conductive traces $176_1$-$176_8$ are organized in ordered rows with the high-density device-to-device conductive traces $176_1$, $176_3$, $176_5$, and $176_7$ used for signalling and the high-density device-to-device conductive traces $176_2$, $176_4$, $176_6$, and $176_8$ are formed and used as ground planes. In another embodiment, as shown in FIG. 17, all of the high-density device-to-device conductive traces $176_1$, $176_2$, $176_4$, $176_5$, $176_7$, and $176_8$ may be used for signalling and are organized in a staggered configuration, and the high-density device-to-device conductive traces $176_3$ and $176_6$ are formed and used as ground planes.

Referring back to FIG. 1, the die side device-to-interposer interconnects 190 over the high-density device-to-device conductive routes 240 may have a finer pitch than the die side device-to-interposer interconnects 190 that are not over the high-density device-to-device conductive routes 240. In one embodiment, the pitch of the die side device-to-interposer interconnects 190 over the high-density device-to-device conductive routes 240 may be between about 20 and 55 microns. As will be understood to those skilled in the art, pitch translation can be implemented. It will also be understood that the die side device-to-interposer interconnects 190 can be full array of fine pitch or a combination of pitches between about 20 and 110 microns.

Figure 18:
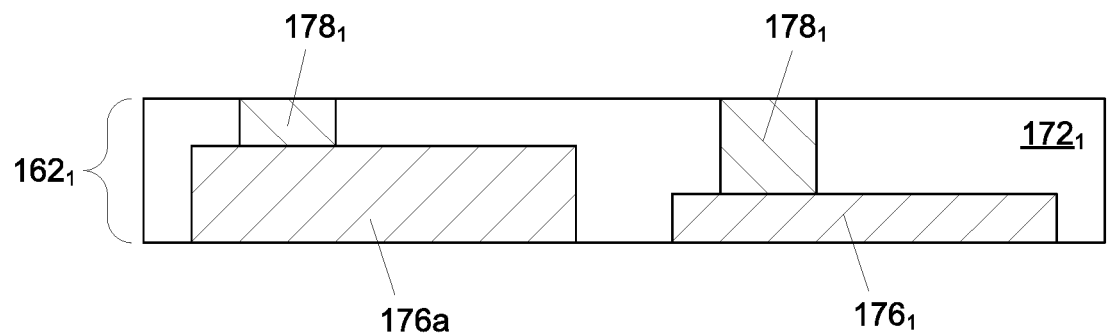
FIGS. 18-22 are side cross-sectional views of various configurations of conductive traces of the middle section having enhanced thicknesses, according to embodiments of the present description.
Figure 19:
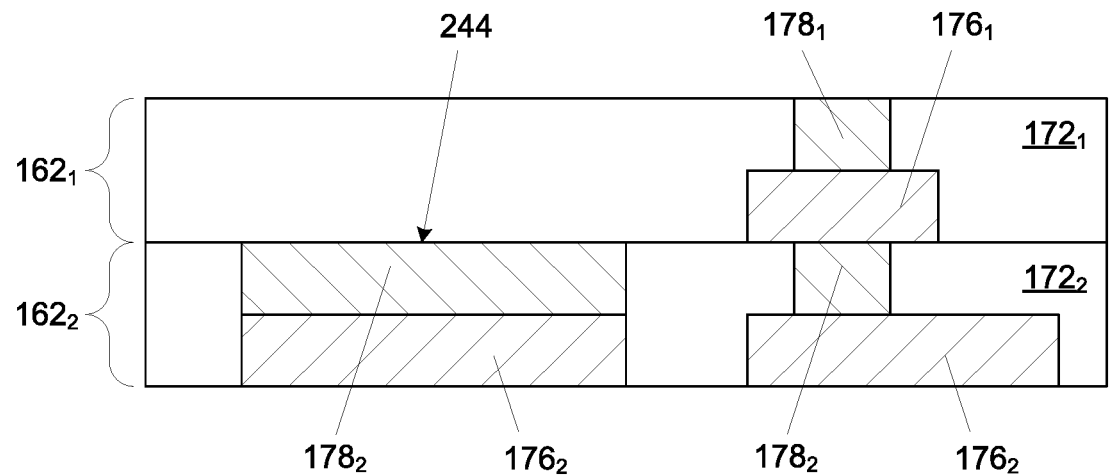

As shown in FIGS. 18-22, the middle section 160 may have at least one conductive trace 176a having an enhanced thickness, which allows general/coarse routing within the thin layers (shown as layers $162_1$, $162_2$, $162_3$, and/or $162_4$ of FIG. 1) of the middle section 160. In an embodiment, the thickened conductive traces 176a may be formed outside of the area where the high-density device-to-device conductive routes 240 (see FIG. 1) are formed (referred to herein as the "general routing area"). In one embodiment, the thickened conductive traces 176a in the middle section 160 may be formed with a thick/thin technology, as described in U.S. Patent Application Publication No. 2018/0331003 A1. When such a thin/thin technology is used, the thickness of the thickened conductive trace 176a in these areas can increase from between about 1 and 7 microns resulting in shorter conductive via $178_1$ thickness between about 0.5 and 3 microns, as shown in FIG. 18 (without thickening is illustrated on the right as conductive trace $176_1$ and with thickening is illustrated on the left as conductive trace 176a). In another embodiment, as shown in FIG. 19, the via formation process may form the conductive via $178_2$ across the entire conductive trace $176_2$ to form a via/trace shunt 244. This allows the via/trace shunt 244 to have a thickness substantially equal to the thickness of the dielectric material layer $172_2$ and still remain at minimum critical dimension. The via/trace shunt 244 may be formed with known lithographically defined via techniques, zero-misalignment via formation techniques, self-aligned via formation techniques, or the like. As further shown in FIG. 19, the dielectric material layer $174_1$ may cover the via/trace shunt 244 to inhibit electrical shorts, as will be understood to those skilled in the art.

Figure 20:
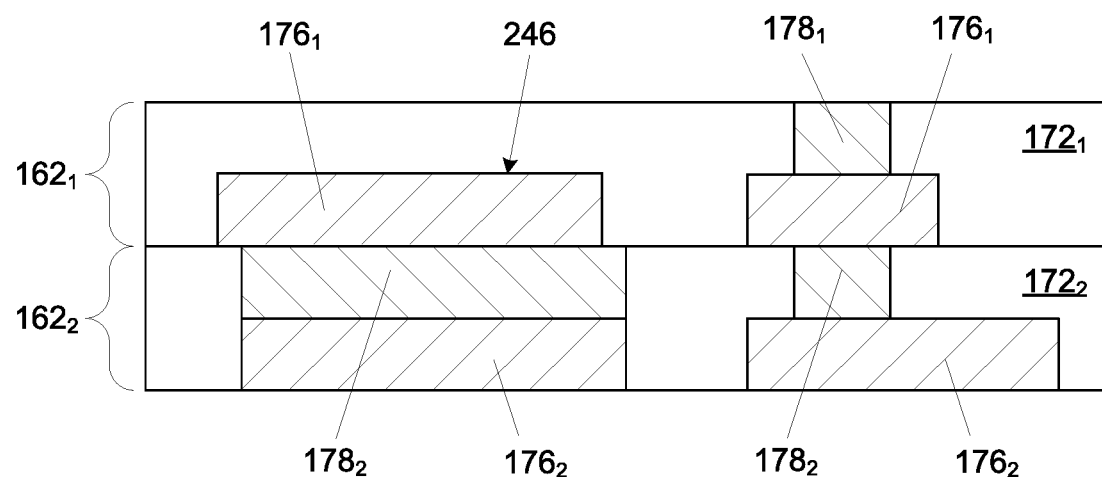
Figure 21:
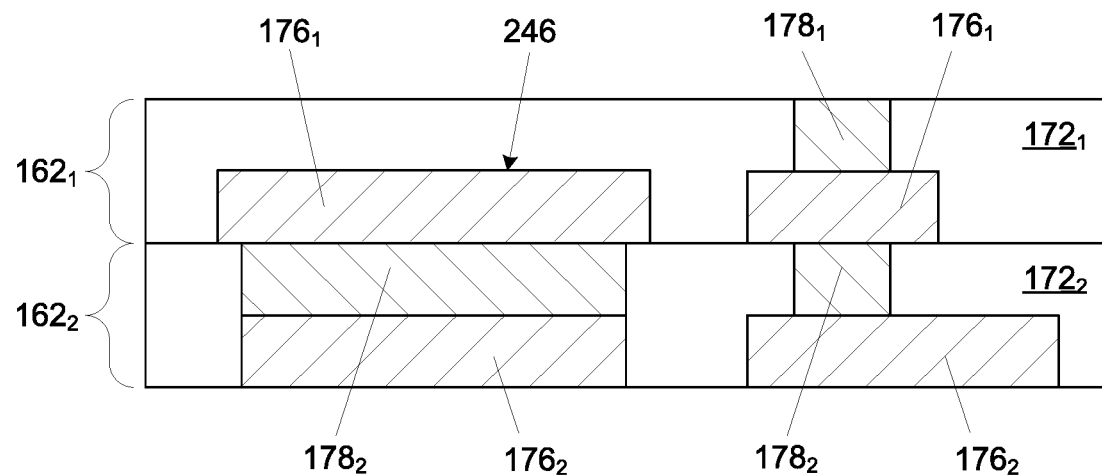
Figure 22:
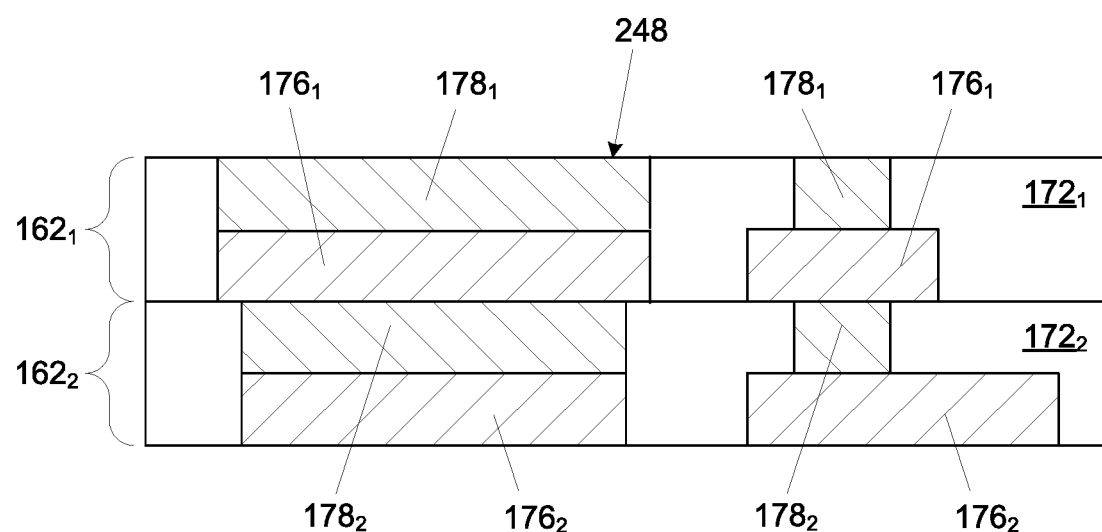

As shown in FIG. 20, the via/trace shunt 244 may be further thickened by forming another conductive trace (i.e. first conductive trace $176_1$) on the via/trace shunt 244 (see FIG. 19) to form a thickened via/trace shunt 246. The conductive trace $176_1$ may be widened relative to the via/trace shunt 244 (see FIG. 19), as shown in FIG. 21, to accommodate any registration/alignment errors. In another embodiment, as shown in FIG. 22, the via formation process may form the conductive via $178_1$ across the thickened via/trace shunt 246 (see FIG. 21) to form a double via/trace shunt 248. This allows the double via/trace shunt 248 to have a thickness substantially equal to the thickness of two dielectric material layers $172_1$ and $172_2$, and still remain at minimum critical dimension.

Figure 23:
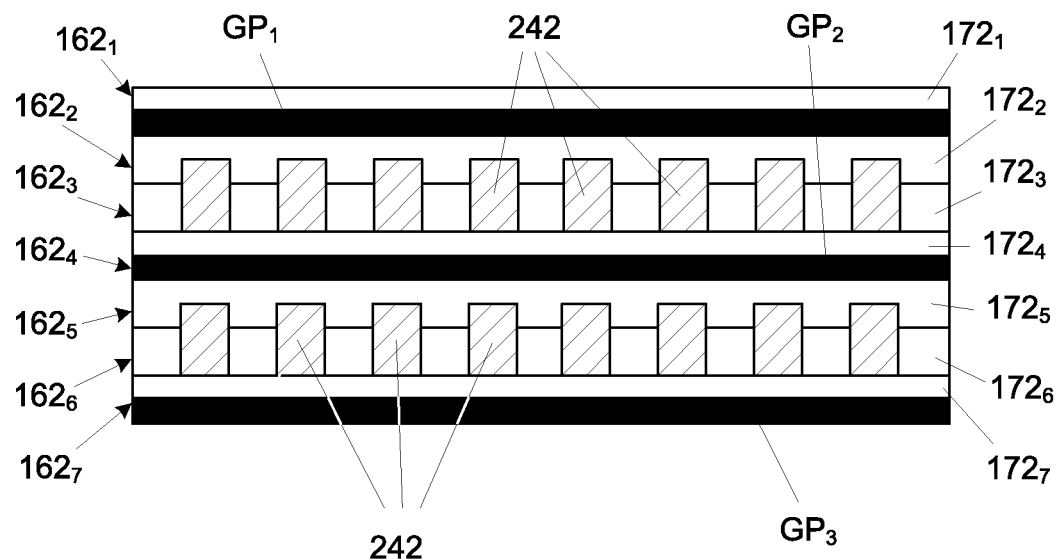
FIGS. 23 and 24 are side cross-sectional views of various configurations of high-density device-to-device conductive routes having enhanced thicknesses, according to embodiments of the present description.
Figure 24:
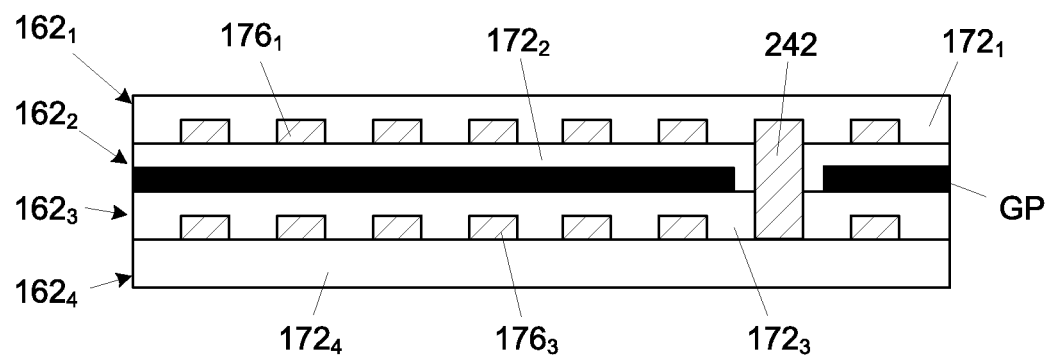

It is understood that the conductive trace thickening process it not limited to the areas outside of the high-density device-to-device conductive routes 240 (see FIG. 1) as discussed with regard to FIGS. 18-22, but may also be used within the high-density device-to-device conductive routes 240. As shown in FIG. 23, the high-density device-to-device conductive routes may extend within two dielectric layers $172_2/172_3$ and $172_5/172_6$, i.e. two actual dielectric layers to form a plurality of thickened high-density device-to-device conductive traces 242. This results in a trade-off of reduced input/output layer count for reduced losses. As also shown in FIG. 23, ground planes GP1, GP2, and GP3 may separate layers of thickened high-density device-to-device conductive traces 242. In a further embodiment shown in FIG. 24, only a portion of the high-density device-to-device conductive traces 240 may be thickened, for instance to deliver a global system signal and/or to have specific lower loss (i.e. lower resistance) traces. As shown, a single thickened trace 242 may be formed and may even extend through at least one ground plane, shown as ground plane GP.

Figure 25:
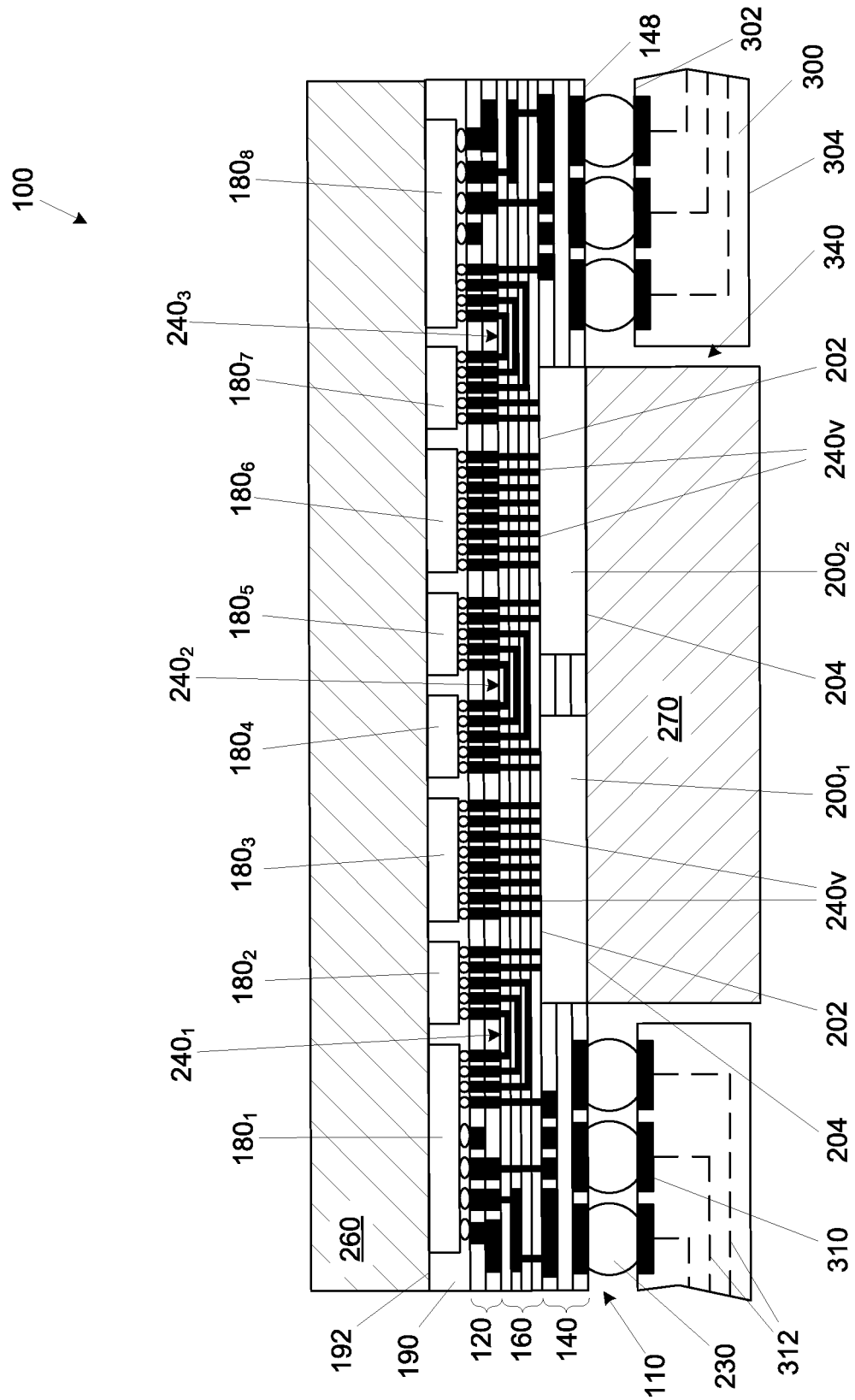
FIG. 25 is a side cross-sectional view of an integrated circuit package, according to one embodiment of the present description.
Figure 26:
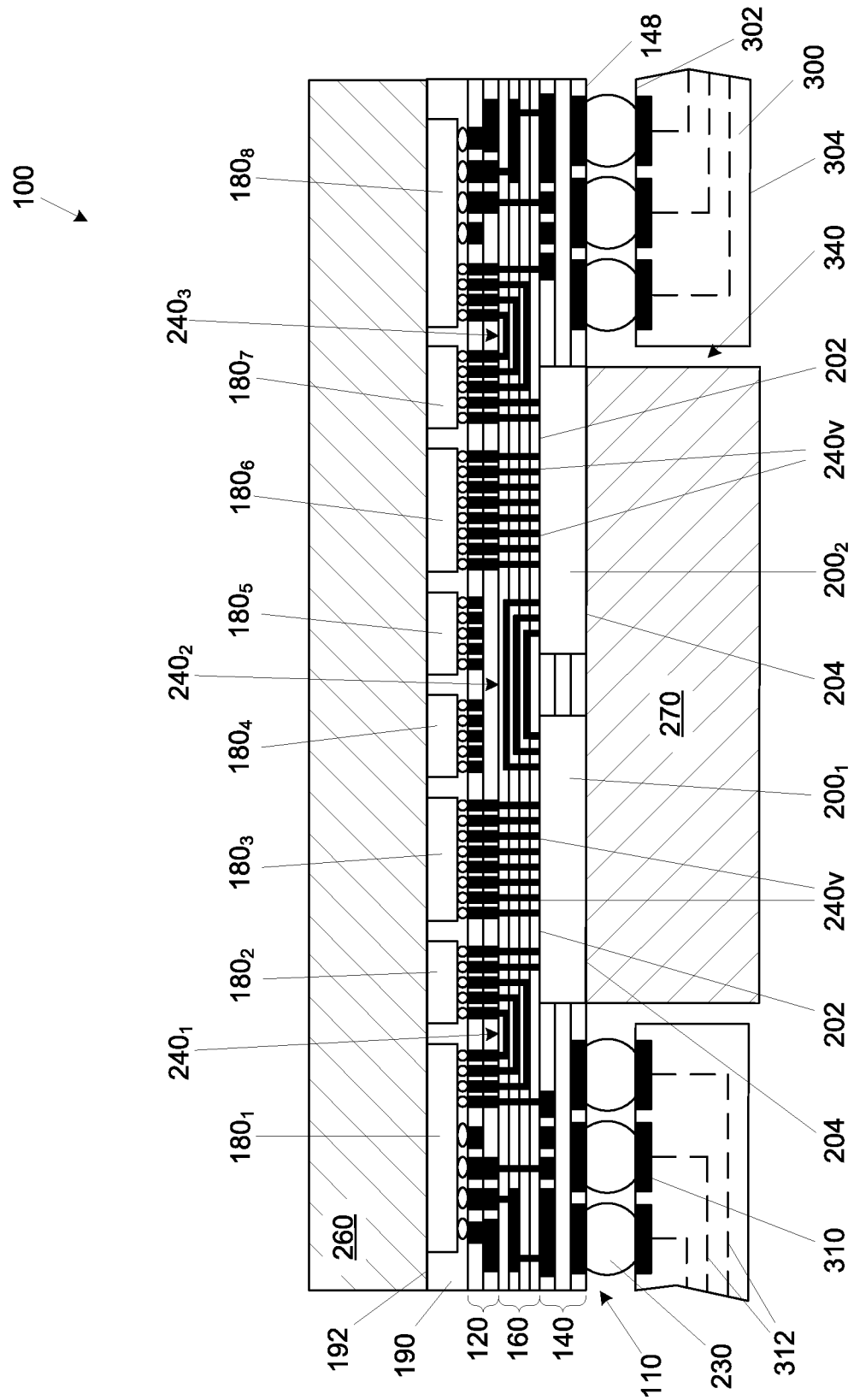
FIG. 26 is a side cross-sectional view of an integrated circuit package, according to another embodiment of the present description.

In a further embodiment as shown in FIG. 25, a plurality of land side integrated circuit devices 200 of FIG. 1 may be electrically attached to the electronic interposer 110. In one embodiment, a first surface 202 of the first land side integrated circuit device $200_1$ and/or the second land side integrated circuit device $200_2$ may be substantially in the same plane as the outer surface 148 of the lower section 140 of the electronic interposer 110. As shown in FIG. 25, the vertical high-density interconnects 240v can be used to electrically connect at least one of the die side integrated circuit devices with at least one of the land side integrated circuit devices, which is illustrated as die side integrated circuit devices $180_2$, $180_3$, and $180_4$ connected to the first land side integrated circuit device $200_1$, and die side integrated circuit devices $180_5$, $180_6$, and $180_7$ with the second land side integrated circuit device $200_2$. As will be understood to those skilled in the art, the vertical high-density interconnects $240_v$ may be connected with through-silicon vias (not shown) on the back side 204 of the first land side integrated circuit device $200_1$ and the second land side integrated circuit device $200_2$, in order to make electrical contact therewith. As further shown in FIG. 25, the first die side integrated circuit device $180_1$ may be electrically connected to the second die side integrated circuit device $180_2$ with the high-density device-to-device conductive routes $240_1$, a fourth die side integrated circuit device $180_4$ may be electrically connected to a fifth die side integrated circuit device 1805 with the high-density device-to-device conductive routes $240_2$, and a seventh die side integrated circuit device $180_7$ may be electrically connected to an eighth die side integrated circuit device $180_8$ with the high-density device-to-device conductive routes $240_3$. It is understood that the interconnection of integrated circuit devices with high-density device-to-device conductive routes is not limited to the die side integrated circuit devices. As shown in FIG. 26, the first land side integrated circuit device $200_1$ may be electrically connected to the second land side integrated circuit device $200_2$ with high-density device-to-device conductive routes $240_2$ within the middle section 160 of the electronic interposer 110.

Figure 27:
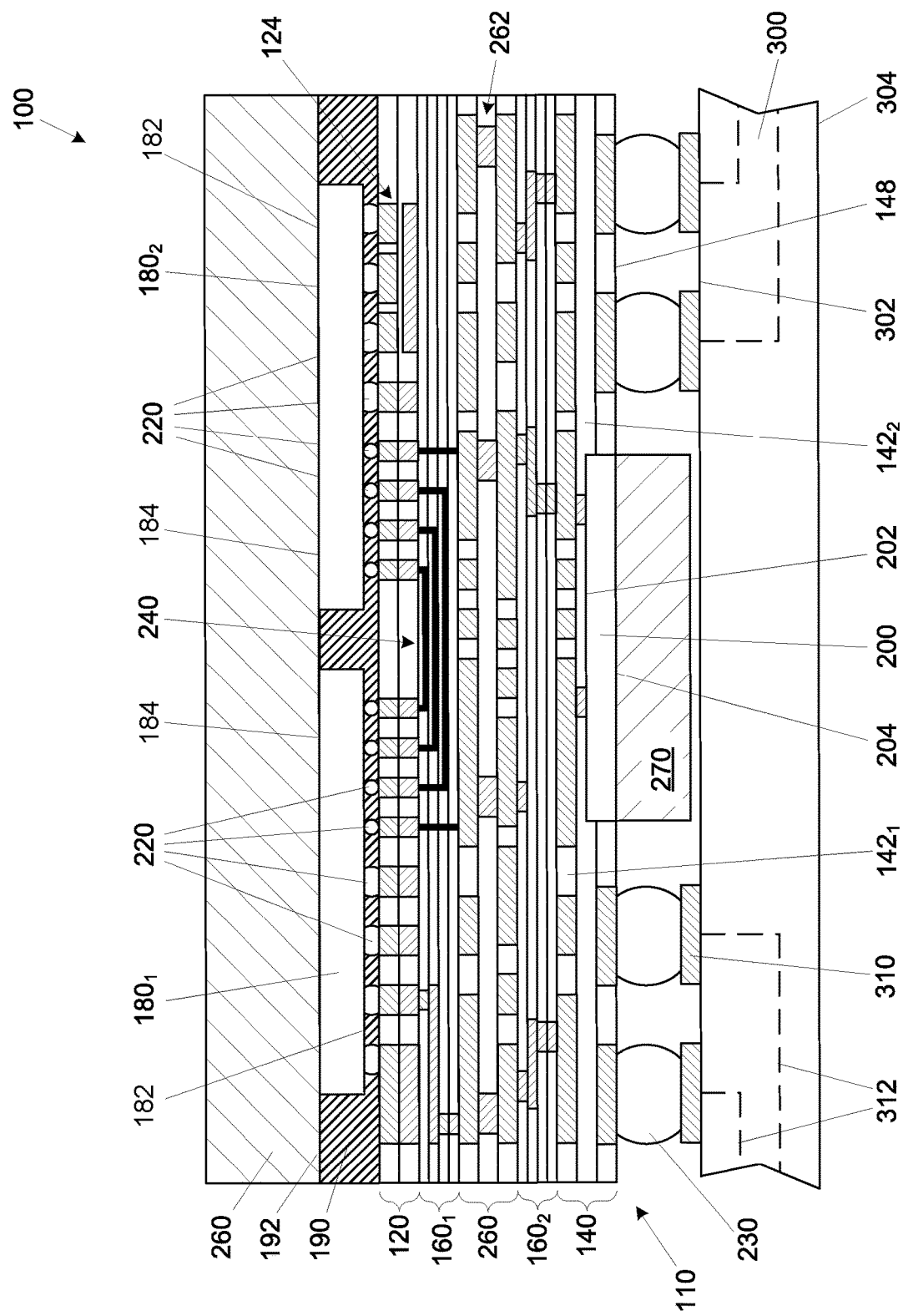
FIG. 27 is a side cross-sectional view of an integrated circuit package, according to still another embodiment of the present description.

Although the previously described embodiment of the present description show a single middle section 160, the embodiments are not so limited. For example, as shown in FIG. 27, the electronic interposer 110 may have multiple middle sections (shown as a first middle section 160₁ and a second middle section 160₂). The first middle section 160₁ and the second middle section 160₂ may be separated by a center section 260, which may be fabricated in the manner described with regard to the upper section 120 and/or the lower section 140, and which may have conductive routes 262 that form electrical connections between the first middle section 160₁ and the second middle section 160₂.

Figure 28:
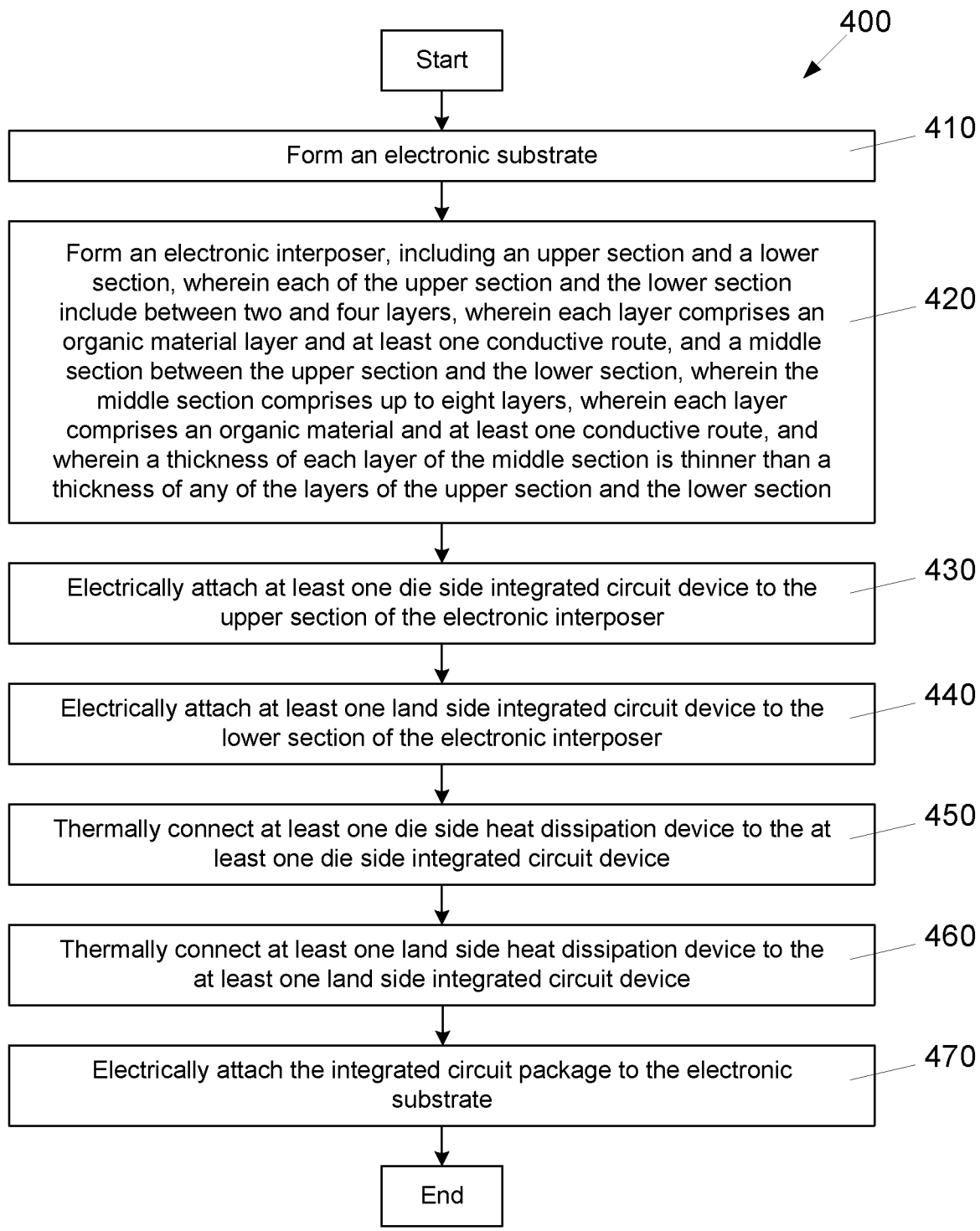
FIG. 28 is a flow diagram of a process of fabricating an integrated circuit assembly, according to an embodiment of the present description.

FIG. 28 is a flow chart of a process 400 of fabricating a lithographic reticle according to an embodiment of the present description. As set forth in block 410, an electronic substrate may be formed. An electronic interposer, including an upper section and a lower section, wherein each of the upper section and the lower section include between two and four layers, wherein each layer comprises an organic material layer and at least one conductive route, and a middle section between the upper section and the lower section, wherein the middle section comprises up to eight layers, wherein each layer comprises an organic material and at least one conductive route, and wherein a thickness of each layer of the middle section is thinner than a thickness of any of the layers of the upper section and the lower section, as set forth in block 420. As set forth in block 430, at least one die side integrated circuit device may be electrically attached to the upper section of the electronic interposer. At least one land side integrated circuit device may be electrically attached to the lower section of the electronic interposer, as set forth in block 440. As set forth in block 450, at least one die side heat dissipation device may be thermally connected to the at least one die side integrated circuit device. At least one land side heat dissipation device may be thermally connected to the at least one land side integrated circuit device, as set forth in block 460. As set forth in block 470, the integrated circuit package may be electrically attached to the electronic substrate.

Although the die side integrated circuit devices and the land side integrated circuit devices may be individual silicon integrated circuit devices, the embodiments of the present description are not so limited. In one specific embodiment, at least one of the die side integrated circuit devices and the land side integrated circuit devices may be a smaller version of one embodiment of the present description.

Figure 29:
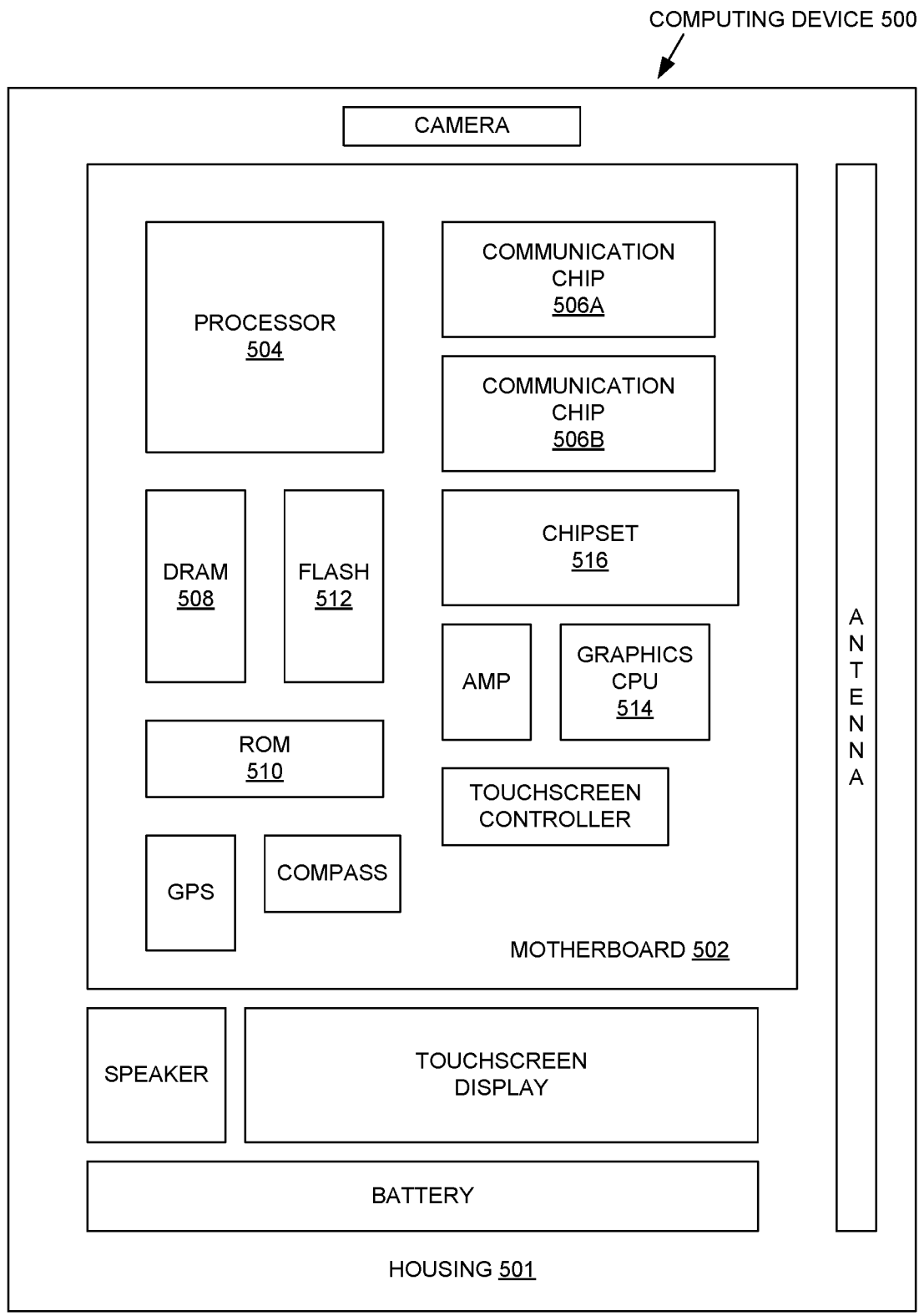
FIG. 29 is an electronic system, according to one embodiment of the present description.

FIG. 29 illustrates an electronic system or computing device 500 in accordance with one implementation of the present description. The computing device 500 may include a housing 501 having a board 502 disposed therein. The computing device 500 may include a number of integrated circuit components, including but not limited to a processor 504, at least one communication chip 506A, 506B, volatile memory 508 (e.g., DRAM), non-volatile memory 510 (e.g., ROM), flash memory 512, a graphics processor or CPU 514, a digital signal processor (not shown), a crypto processor (not shown), a chipset 516, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 502. In some implementations, at least one of the integrated circuit components may be a part of the processor 504.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip or device may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit package comprising an electronic interposer, including an upper section and a lower section, wherein each of the upper section and the lower section include between two and four layers, wherein each layer comprises an organic material layer and at least one conductive route; and a middle section between the upper section and the lower section, wherein the middle section comprises up to eight layers, wherein each layer comprises an organic material and at least one conductive route, and wherein a thickness of each layer of the middle section is thinner than a thickness of any of the layers of the upper section and the lower section; at least one die side integrated circuit device electrically attached to the upper section of the electronic interposer; at least one die side heat dissipation device thermally connected to the at least one die side integrated circuit device; at least one land side integrated circuit device electrically attached to the lower section of the electronic interposer; and at least one land side heat dissipation device thermally connected to the at least one land side integrated circuit device.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-29. The subject matter may be applied to other integrated circuit devices and assembly applications, as well as any appropriate electronic application, as will be understood to those skilled in the art.

The follow examples pertain to further embodiments and specifics in the examples may be used anywhere in one or more embodiments, wherein Example 1 is an electronic interposer, including an upper section and a lower section, wherein each of the upper section and the lower section include between two and four layers, wherein each layer comprises an organic material layer and at least one conductive route; a middle section between the upper section and the lower section, wherein the middle section comprises up to eight layers, wherein each layer comprises an organic material and at least one conductive route, and wherein a thickness of each layer of the middle section is thinner than a thickness of any of the layers of the upper section and thinner than a thickness of any of the layers of the lower section; at least one die side integrated circuit device electrically attached to the upper section of the electronic interposer; at least one die side heat dissipation device thermally connected to the at least one die side integrated circuit device; at least one land side integrated circuit device electrically attached to the lower section of the electronic interposer; and at least one land side heat dissipation device thermally connected to the at least one land side integrated circuit device.

In Example 2, the subject matter of Example 1 can optionally include the at least one land side integrated circuit device being at least partially embedded in the lower section of the electronic interposer.

In Example 3, the subject matter of Example 2 can optionally include a back surface of the at least one land side integrated circuit device being on substantially the same plane as an outer surface of the lower section.

In Example 4, the subject matter of Example 1 can optionally include the at least one die side integrated circuit device being at least partially encased in a mold material layer.

In Example 5, the subject matter of Example 4 can optionally include a back surface of the at least one land side integrated circuit device being on substantially the same plane as an outer surface of the mold material layer.

In Example 6, the subject matter of any of Examples 1 to 5 can optionally include the thickness of each layer of the upper section being between about 13 and 40 microns, wherein the thickness of each layer of the upper section is between about 13 and 40 microns, and wherein the thickness of each layer of the middle section is between about 1.5 and 9 microns.

In Example 7, the subject matter of any of Examples 1 to 6 can optionally include the at least one conductive route of the upper section, the middle section, and the lower second comprising at least one conductive trace and at least one conductive via; wherein the at least one conductive trace of the upper section comprises a plurality of conductive traces having a width of about 8 microns or greater, a spacing of about 8 microns or greater, and a thickness of between 8 and 15 microns; wherein the at least one conductive trace of the lower section comprises a plurality of conductive traces having a width of about 8 microns or greater, a spacing of about 8 microns or greater, and a thickness of between 8 and 15 microns; and wherein the at least one conductive trace of the middle section comprises a plurality of conductive traces having a width between about 0.75 microns and 3 microns, a spacing between about 0.75 microns and 3 microns, and a thickness of between 0.5 microns and 4 microns, and wherein the at least one conductive via has a thickness of between about 1 and 6 microns.

In Example 8, the subject matter of any of Examples 1 to 7 can optionally include the at least one conductive route of the at least one of the middle section comprising at least one conductive trace and at least one conductive via; and wherein at least one conductive trace of the middle section having an enhanced thickness.

In Example 9, the subject matter of any of Examples 1 to 8 can optionally include at least one high-density device-to-device conductive route within the middle section which electrically interconnects one die side integrated circuit device of the plurality of die side integrated circuit devices with another die side integrated circuit device of the plurality of die side integrated circuit devices.

In Example 10, the subject matter of any of Examples 1 to 9 can optionally include the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

Example 11 is an electronic system, comprising an electronic substrate and an integrated circuit package electrically attached to the electronic substrate, wherein the integrated circuit package comprises an electronic interposer, including an upper section and a lower section, wherein each of the upper section and the lower section include between two and four layers, wherein each layer comprises an organic material layer and at least one conductive route; a middle section between the upper section and the lower section, wherein the middle section comprises up to eight layers, wherein each layer comprises an organic material and at least one conductive route, and wherein a thickness of each layer of the middle section is thinner than a thickness of any of the layers of the upper section and thinner than a thickness of any of the layers of the lower section; at least one die side integrated circuit device electrically attached to the upper section of the electronic interposer; at least one die side heat dissipation device thermally connected to the at least one die side integrated circuit device; at least one land side integrated circuit device electrically attached to the lower section of the electronic interposer; and at least one land side heat dissipation device thermally connected to the at least one land side integrated circuit device.

In Example 12, the subject material of Example 11 can optionally include the electronic substrate including a recess therein and wherein the at least one land side heat dissipation device extends at least partially into the recess.

In Example 13, the subject material of Example 11 can optionally include the electronic substrate including an opening therethrough and wherein the at least one land side heat dissipation device extends at least partially through the opening.

In Example 14, the subject matter of Example 11 can optionally include the at least one land side integrated circuit device being at least partially embedded in the lower section of the electronic interposer.

In Example 15, the subject matter of Example 14 can optionally include a back surface of the at least one land side integrated circuit device being on substantially the same plane as an outer surface of the lower section.

In Example 16, the subject matter of Example 11 can optionally include the at least one die side integrated circuit device being at least partially encased in a mold material layer.

In Example 17, the subject matter of Example 16 can optionally include a back surface of the at least one land side integrated circuit device being on substantially the same plane as an outer surface of the mold material layer.

In Example 18, the subject matter of any of Examples 11 to 17 can optionally include the thickness of each layer of the upper section being between about 13 and 40 microns, wherein the thickness of each layer of the upper section is between about 13 and 40 microns, and wherein the thickness of each layer of the middle section is between about 1.5 and 9 microns.

In Example 19, the subject matter of any of Examples 11 to 18 can optionally include the at least one conductive route of the upper section, the middle section, and the lower second comprising at least one conductive trace and at least one conductive via; wherein the at least one conductive trace of the upper section comprises a plurality of conductive traces having a width of about 8 microns or greater, a spacing of about 8 microns or greater, and a thickness of between 8 and 15 microns; wherein the at least one conductive trace of the lower section comprises a plurality of conductive traces having a width of about 8 microns or greater, a spacing of about 8 microns or greater, and a thickness of between 8 and 15 microns; and wherein the at least one conductive trace of the middle section comprises a plurality of conductive traces having a width between about 0.75 microns and 3 microns, a spacing between about 0.75 microns and 3 microns, and a thickness of between 0.5 microns and 4 microns, and wherein the at least one conductive via has a thickness of between about 1 and 6 microns.

In Example 20, the subject matter of any of Examples 11 to 19 can optionally include the at least one conductive route of the at least one of the middle section comprising at least one conductive trace and at least one conductive via; and wherein at least one conductive trace of the middle section having an enhanced thickness.

In Example 21, the subject matter of any of Examples 11 to 20 can optionally include at least one high-density device-to-device conductive route within the middle section which electrically interconnects one die side integrated circuit device of the plurality of die side integrated circuit devices with another die side integrated circuit device of the plurality of die side integrated circuit devices.

In Example 22, the subject matter of any of Examples 11 to 21 can optionally include the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

Example 23 is a method of fabricating an integrated circuit assembly comprising forming an electronic substrate; forming an electronic interposer, including an upper section and a lower section, wherein each of the upper section and the lower section include between two and four layers, wherein each layer comprises an organic material layer and at least one conductive route; and a middle section between the upper section and the lower section, wherein the middle section comprises up to eight layers, wherein each layer comprises an organic material and at least one conductive route, and wherein a thickness of each layer of the middle section is thinner than a thickness of any of the layers of the upper section and the lower section; electrically attaching at least one die side integrated circuit device to the upper section of the electronic interposer; electrically attaching at least one land side integrated circuit device to the lower section of the electronic interposer; thermally connecting at least one die side heat dissipation device to the at least one die side integrated circuit device; thermally connecting at least one land side heat dissipation device to the at least one land side integrated circuit device; and electrically attaching the integrated circuit package to the electronic substrate.

In Example 24, the subject matter of Example 23 can optionally include forming the electronic substrate further comprises forming a recess in the electronic substrate and wherein electrically attaching the integrated circuit package to the electronic substrate includes positioning the at least one land side heat dissipation device to extend at least partially into the recess.

In Example 25, the subject matter of Example 23 can optionally include forming the electronic substrate further comprises forming an opening through the electronic substrate and wherein electrically attaching the integrated circuit package to the electronic substrate includes positioning the at least one land side heat dissipation device to extend at least partially through the opening.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit package, comprising:
   an electronic interposer, including an upper section and a lower section, wherein each of the upper section and the lower section include between two and four layers, wherein each layer comprises an organic material layer and at least one conductive route; and a middle section between the upper section and the lower section, wherein the middle section comprises up to eight layers, wherein each layer comprises an organic material and at least one conductive route, and wherein a thickness of each layer of the middle section is thinner than a thickness of any of the layers of the upper section and the lower section;
   at least one die side integrated circuit device electrically attached to the upper section of the electronic interposer;
   at least one die side heat dissipation device thermally connected to the at least one die side integrated circuit device;
   at least one land side integrated circuit device electrically attached to the lower section of the electronic interposer; and
   at least one land side heat dissipation device thermally connected to the at least one land side integrated circuit device.

2. The integrated circuit package of claim 1, wherein at least one land side integrated circuit device is at least partially embedded in the lower section of the electronic interposer.

3. The integrated circuit package of claim 2, wherein a back surface of the at least one land side integrated circuit device is on substantially the same plane as an outer surface of the lower section.

4. The integrated circuit package of claim 1, wherein at least one die side integrated circuit device is at least partially encased in a mold material layer.

5. The integrated circuit package of claim 4, wherein a back surface of at least one die side integrated circuit device is on substantially the same plane as an outer surface of the mold material layer.

6. The integrated circuit package of claim 1, wherein the thickness of each layer of the upper section is between about 13 and 40 microns, wherein the thickness of each layer of the lower section is between about 13 and 40 microns, and wherein the thickness of each layer of the middle section is between about 1.5 and 9 microns.

7. The integrated circuit package of claim 1, wherein the at least one conductive route of the upper section, the middle section, and the lower second comprises at least one conductive trace and at least one conductive via; wherein the at least one conductive trace of the upper section comprises a plurality of conductive traces having a width of about 8 microns or greater, a spacing of about 8 microns or greater, and a thickness of between 8 and 15 microns; wherein the at least one conductive trace of the lower section comprises a plurality of conductive traces having a width of about 8 microns or greater, a spacing of about 8 microns or greater, and a thickness of between 8 and 15 microns; and wherein the at least one conductive trace of the middle section comprises a plurality of conductive traces having a width between about 0.75 microns and 3 microns, a spacing between about 0.75 microns and 3 microns, and a thickness of between 0.5 microns and 4 microns, and wherein the at least one conductive via has a thickness of between about 1 and 6 microns.

8. The integrated circuit package of claim 1, wherein the at least one conductive route of the middle section comprises at least one conductive trace and at least one conductive via; and wherein at least one conductive trace of the middle section has an enhanced thickness.

9. The integrated circuit package of claim 1, further comprising at least one high-density device-to-device conductive route within the middle section which electrically interconnects one die side integrated circuit device of the plurality of die side integrated circuit devices with another die side integrated circuit device of the plurality of die side integrated circuit devices.

10. The integrated circuit package of claim 1, wherein the at least one land side integrated circuit device comprises a plurality of land side integrated circuit devices; and further comprising at least one high-density device-to-device conductive route within the middle section which electrically interconnects one land side integrated circuit device of the plurality of land side integrated circuit devices with another land side integrated circuit device of the plurality of land side integrated circuit devices.

* * * * *